(12) United States Patent
Tsai et al.

(10) Patent No.: US 12,389,667 B2
(45) Date of Patent: *Aug. 12, 2025

(54) FIN FIELD-EFFECT TRANSISTOR DEVICE AND METHOD

(71) Applicant: Taiwan Semiconductor Manufacturing Co., Ltd., Hsinchu (TW)

(72) Inventors: Meng Jhe Tsai, Hsinchu (TW); Hong-Jie Yang, Hsinchu (TW); Meng-Chun Chang, Taipei (TW); Hao Chiang, Hsinchu (TW); Chia-Ying Lee, New Taipei (TW); Huan-Just Lin, Hsinchu (TW); Chuan Chang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/741,063

(22) Filed: Jun. 12, 2024

(65) Prior Publication Data

US 2024/0332085 A1    Oct. 3, 2024

Related U.S. Application Data

(63) Continuation of application No. 17/329,998, filed on May 25, 2021, now Pat. No. 12,040,233.

(Continued)

(51) Int. Cl.
*H10D 30/62* (2025.01)
*H10D 30/01* (2025.01)

(Continued)

(52) U.S. Cl.
CPC ......... *H10D 84/038* (2025.01); *H10D 30/024* (2025.01); *H10D 30/6211* (2025.01); *H10D 84/0158* (2025.01); *H10D 84/853* (2025.01)

(58) Field of Classification Search
CPC ......... H01L 21/823431; H01L 27/0924; H01L 29/66795; H01L 29/7851; H10D 30/024;

(Continued)

(56) References Cited

U.S. PATENT DOCUMENTS 8,207,060 B2    6/2012   Yang
8,828,881 B2    9/2014   Meng et al.

(Continued)

FOREIGN PATENT DOCUMENTS

CN    101903990 A    12/2010
KR    20160129664 A    11/2016

(Continued)

*Primary Examiner* — Monica D Harrison
(74) *Attorney, Agent, or Firm* — Slater Matsil, LLP

(57) ABSTRACT

A method of forming a semiconductor device includes: forming a metal gate structure over a fin that protrudes above a substrate, the metal gate structure being surrounded by an interlayer dielectric (ILD) layer; recessing the metal gate structure below an upper surface of the ILD layer distal from the substrate; after the recessing, forming a first dielectric layer over the recessed metal gate structure; forming an etch stop layer (ESL) over the first dielectric layer and the ILD layer; forming a second dielectric layer over the ESL; performing a first dry etch process to form an opening that extends through the second dielectric layer, through the ESL, and into the first dielectric layer; after the first dry etch process, performing a wet etch process to clean the opening; and after the wet etch process, performing a second dry etch process to extend the opening through the first dielectric layer.

20 Claims, 25 Drawing Sheets

Related U.S. Application Data

(60) Provisional application No. 63/159,008, filed on Mar. 10, 2021.

(51) Int. Cl.
   *H10D 84/01* (2025.01)
   *H10D 84/03* (2025.01)
   *H10D 84/85* (2025.01)

(58) Field of Classification Search
   CPC ............. H10D 30/6211; H10D 30/025; H10D 30/027; H10D 30/031; H10D 30/0312; H10D 30/0314; H10D 30/0316; H10D 30/6212; H10D 30/67; H10D 30/6728
   USPC ........................................................ 438/478
   See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,163,704 B2 | 12/2018 | Chen et al. |
| 10,249,530 B2 | 4/2019 | Wang et al. |
| 10,522,640 B2 | 12/2019 | Jangjian et al. |
| 10,714,329 B2 | 7/2020 | Lin et al. |
| 12,040,233 B2 * | 7/2024 | Tsai .................. H01L 29/66795 |
| 2015/0228793 A1 | 8/2015 | Chen et al. |
| 2016/0181163 A1 | 6/2016 | Huang et al. |
| 2018/0174904 A1 | 6/2018 | Hsieh et al. |
| 2020/0006228 A1 | 1/2020 | Yang et al. |
| 2020/0083379 A1 | 3/2020 | Chang et al. |
| 2020/0105931 A1 | 4/2020 | Wu et al. |
| 2020/0365698 A1 | 11/2020 | Tsai et al. |

FOREIGN PATENT DOCUMENTS

| | | |
|---|---|---|
| KR | 20170078514 A | 7/2017 |
| KR | 20200037071 A | 4/2020 |
| TW | 201714217 A | 4/2017 |
| WO | 2012092695 A1 | 7/2012 |

* cited by examiner

FIN FIELD-EFFECT TRANSISTOR DEVICE AND METHOD

PRIORITY CLAIM AND CROSS-REFERENCE

This application is a continuation of U.S. patent application Ser. No. 17/329,998, filed May 25, 2021, entitled "Fin Field-Effect Transistor Device and Method," which claims priority to U.S. Provisional Patent Application No. 63/159,008, filed Mar. 10, 2021, entitled "Optimized Etch Sequence for VG Etch Beyond 3 nm Node," which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of forming a semiconductor device, and in particular, in the context of forming vias for a Fin Field-Effect Transistor (FinFET) device. The principle of the disclosed embodiments may also be applied to other types of devices, such as planar devices.

In accordance with an embodiment of the present disclosure, a multi-step etching process, which includes a first dry etch process, a wet etch process, and a second dry etch process, is performed to form via holes that extend through multiple dielectric layers (e.g., an oxide layer over a nitride layer) to expose the underlying conductive features. The multi-step etching process is advantageous for scenarios where residue metal regions are formed between the multiple dielectric layers, which residue metal regions are formed by insufficient removal of fill metals by a planarization process (e.g., CMP). Since the residue metal regions may block the via hole etching process, the disclosed multi-step etching process ensures that the via holes are formed properly, regardless of whether the residue metal regions exist.

Figure 1:
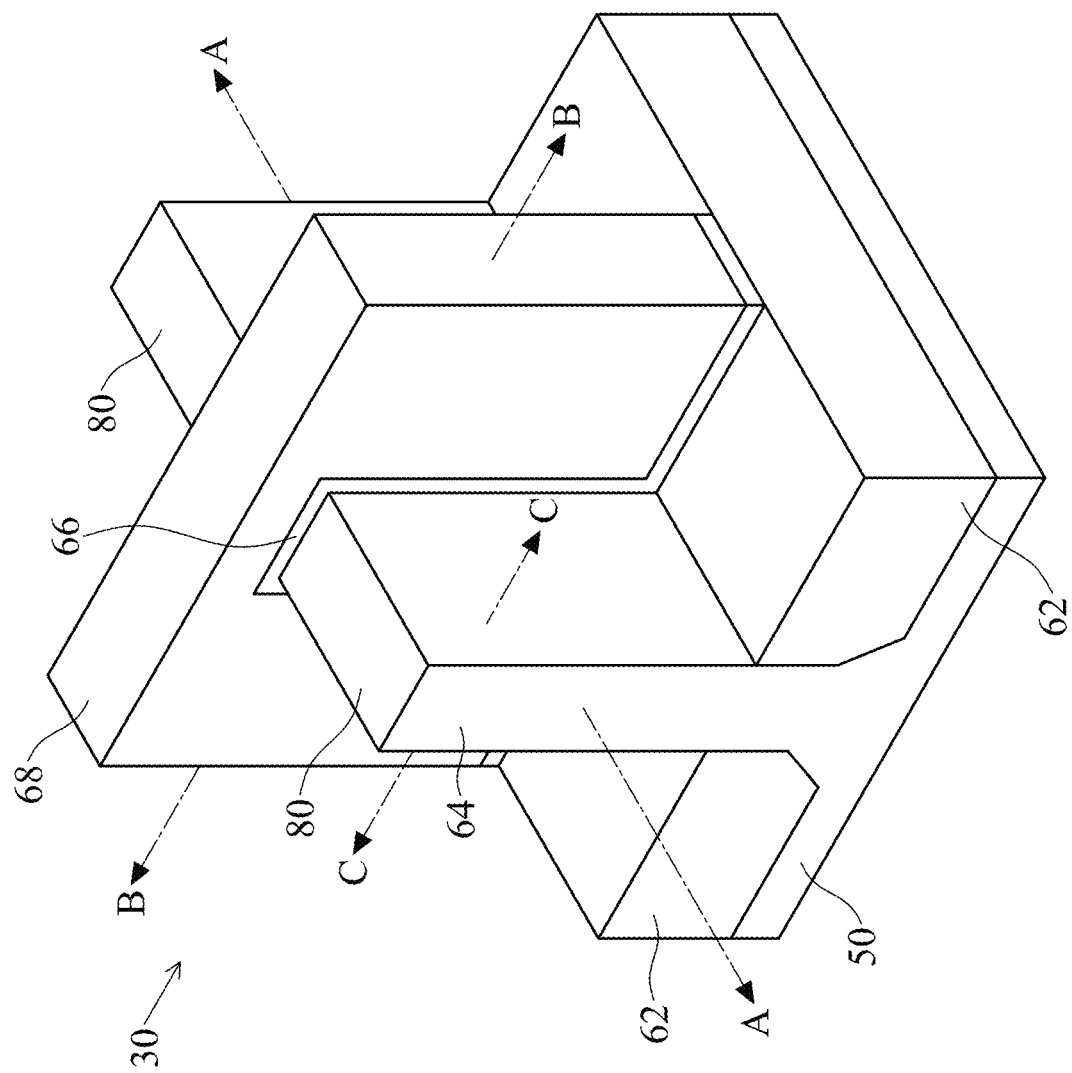
FIG. 1 is a perspective view of a Fin Field-Effect Transistor (FinFET), in accordance with some embodiments.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Subsequent figures refer to these reference cross-sections for clarity.

FIGS. 2-24 illustrate cross-sectional views of a FinFET device 100 at various stages of fabrication, in accordance with an embodiment. The FinFET device 100 is similar to the FinFET 30 in FIG. 1, except for multiple fins and multiple gate structures. FIGS. 2-5 illustrate cross-sectional views of the FinFET device 100 along cross-section B-B, and FIGS. 6-24 illustrate cross-sectional views of the FinFET device 100 along cross-section A-A.

Figure 2:
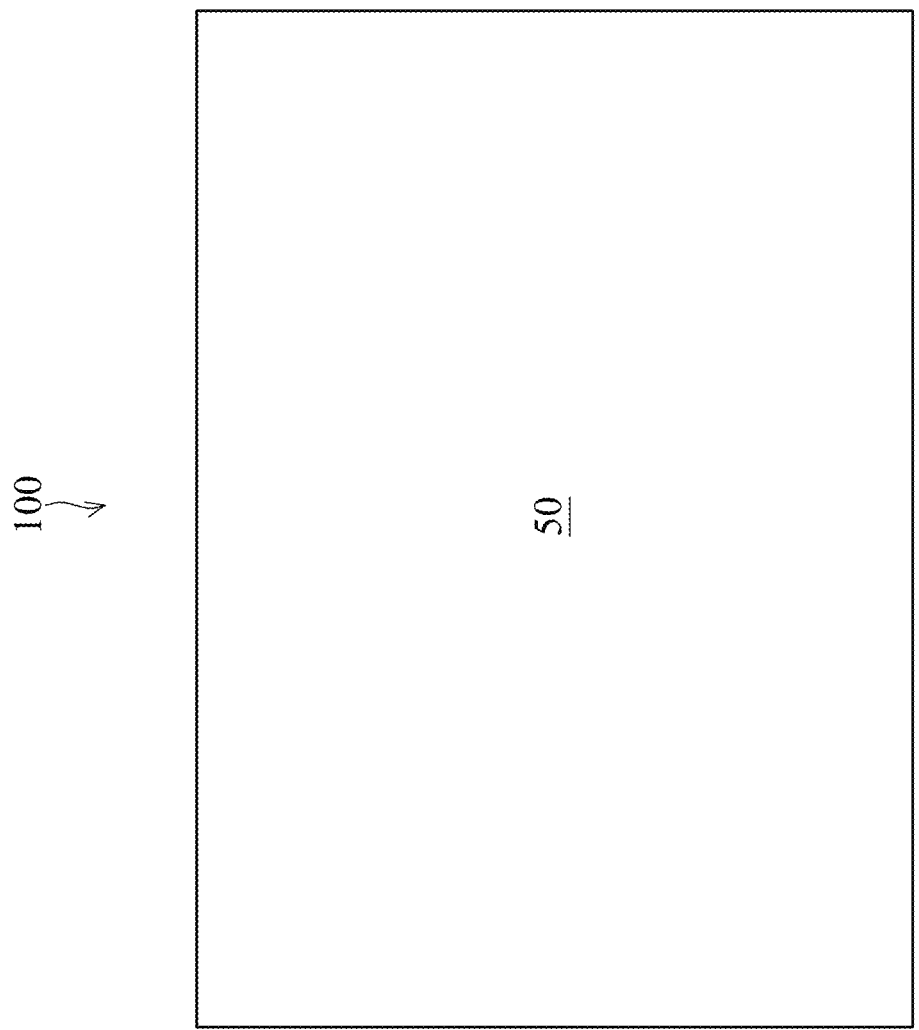
FIGS. 2-24 illustrate cross-sectional views of a FinFET device at various stages of fabrication, in accordance with an embodiment.

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
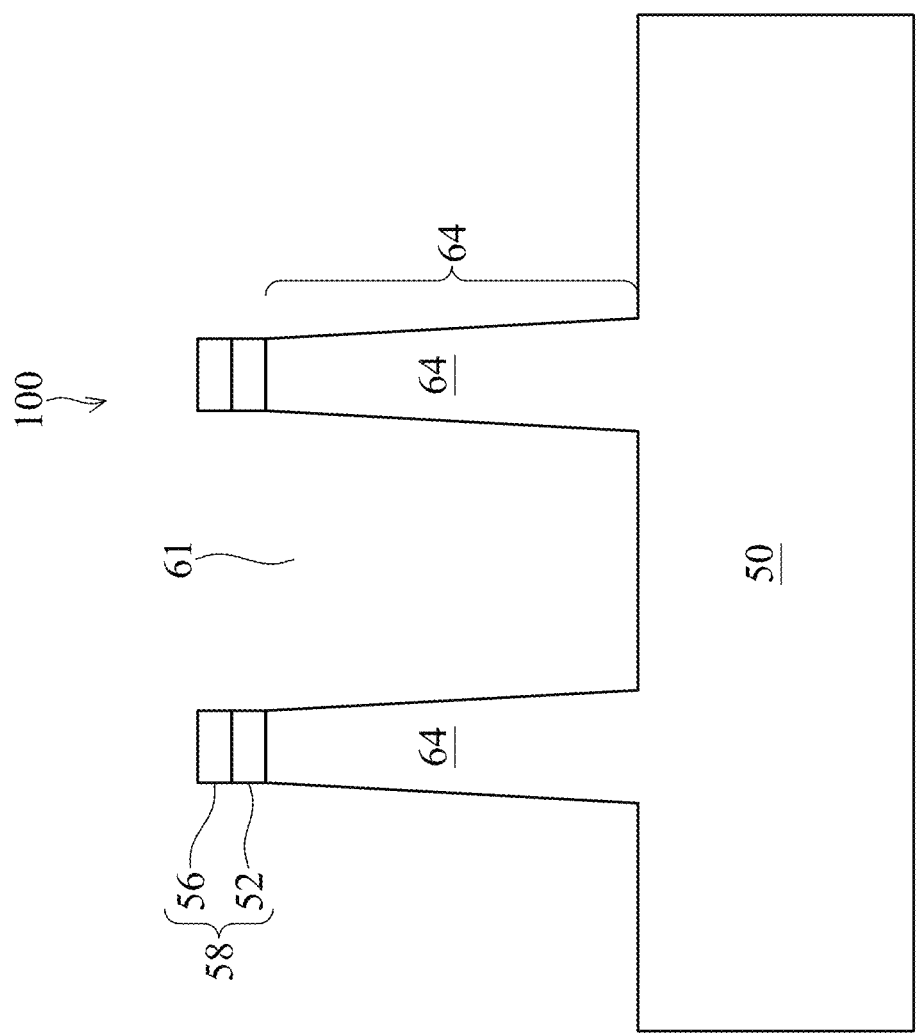

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
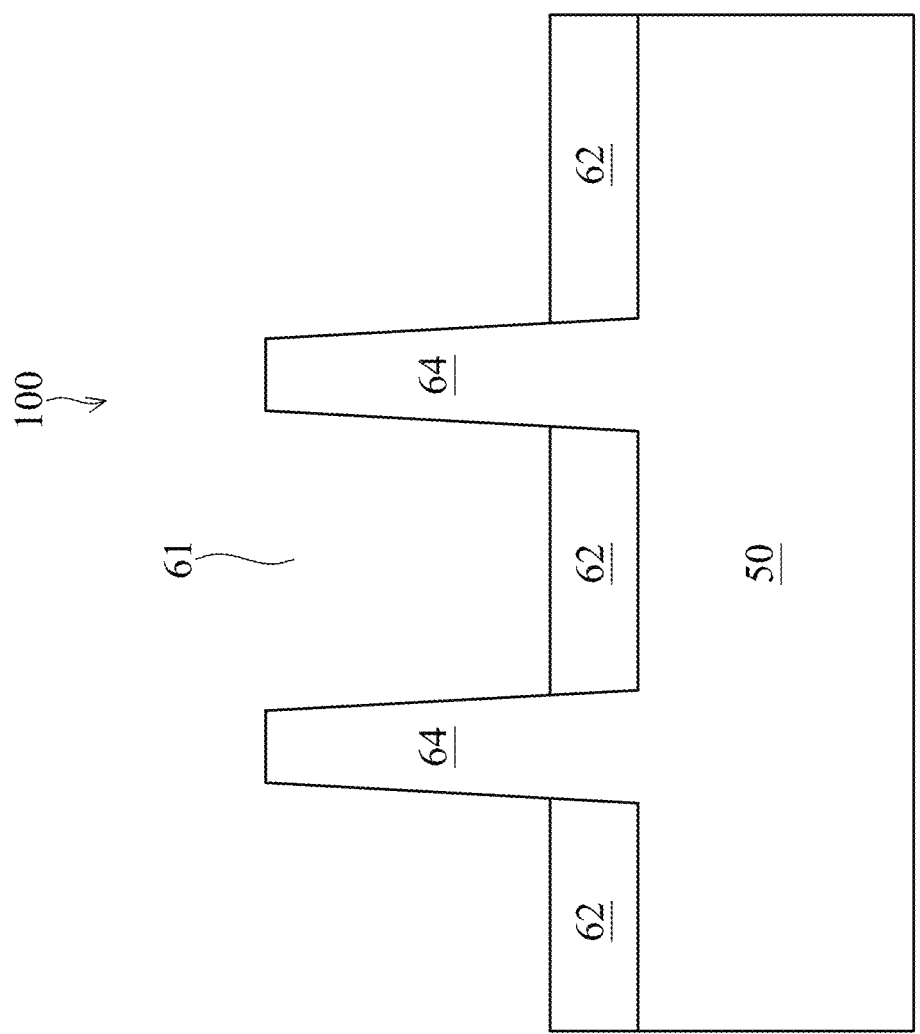

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch, or a wet etch using dilute hydrofluoric (dHF) acid, may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., n-type or p-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AIP, GaP, and the like.

Figure 5:
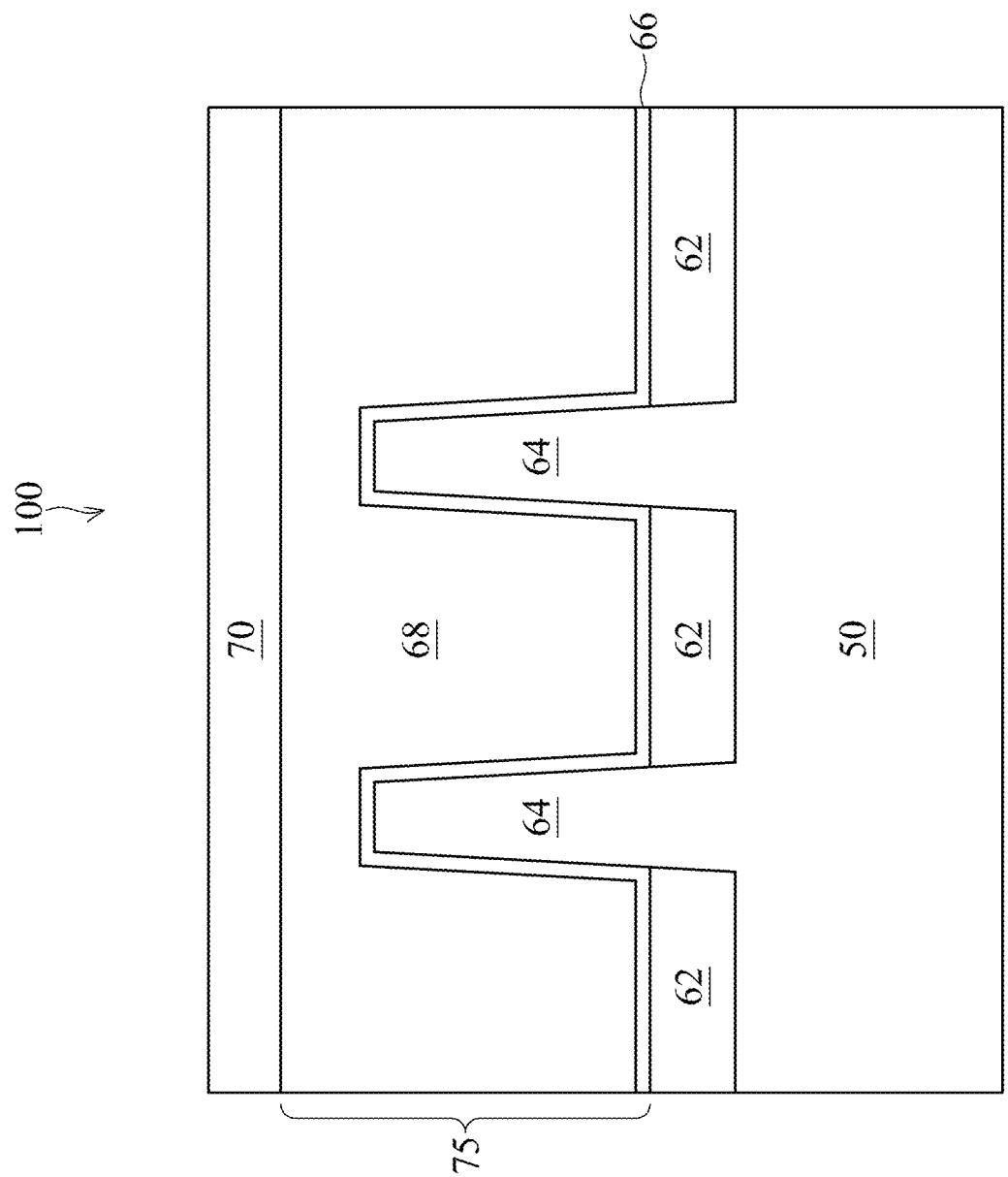

FIG. 5 illustrates the formation of dummy gate structure 75 over the semiconductor fins 64. Dummy gate structure 75 includes gate dielectric 66 and gate electrode 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

Figure 6:
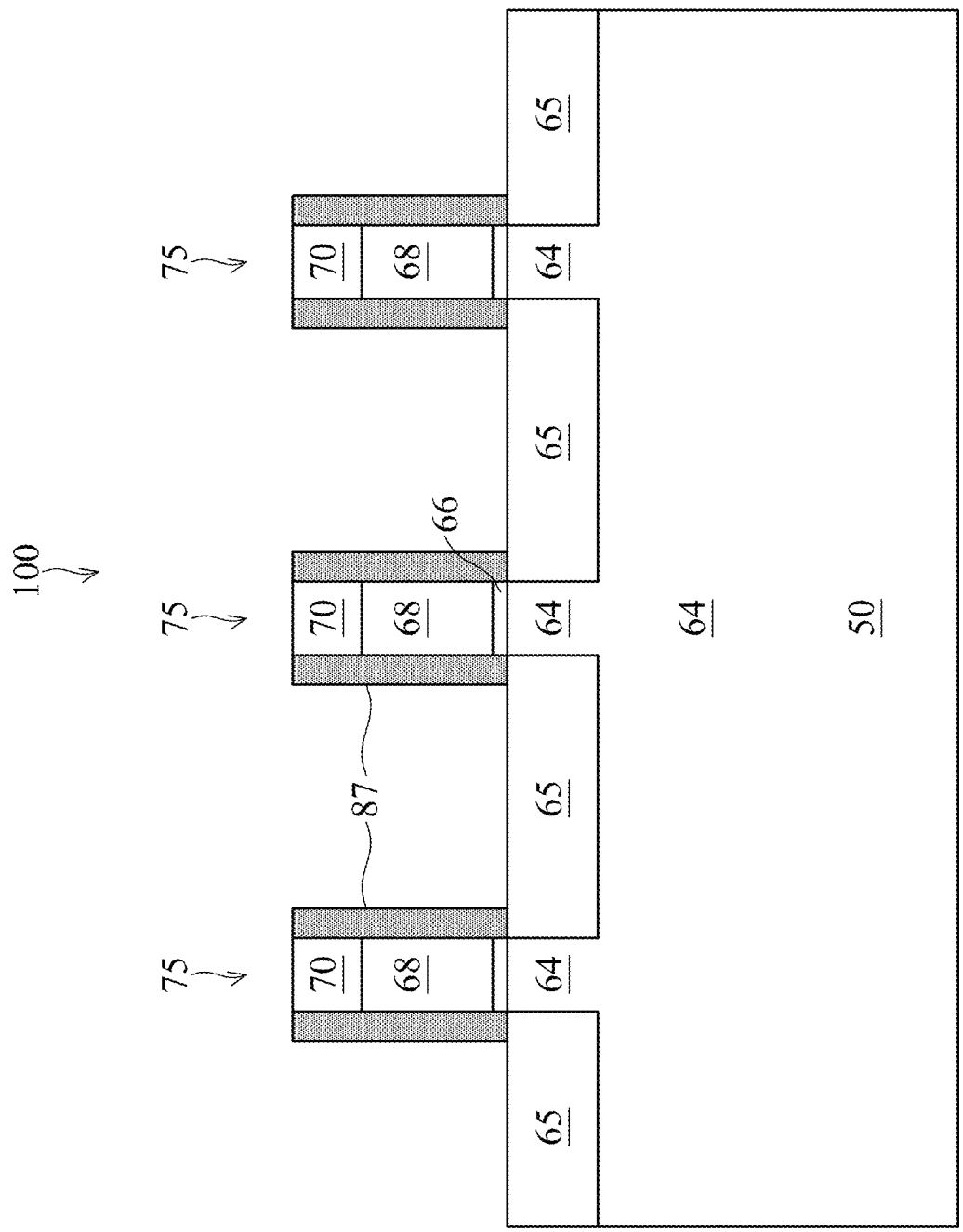

Next, as illustrated in FIG. 6, lightly doped drain (LDD) regions 65 are formed in the fins 64. The LDD regions 65 may be formed by an implantation process. The implantation process may implant n-type or p-type impurities in the fins 64 to form the LDD regions 65. In some embodiments, the LDD regions 65 abut the channel region of the FinFET device 100. Portions of the LDD regions 65 may extend under gate electrode 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed.

Still referring to FIG. 6, after the LDD regions 65 are formed, gate spacers 87 are formed on the gate structure. In the example of FIG. 6, the gate spacers 87 are formed on opposing sidewalls of the gate electrode 68 and on opposing sidewalls of the gate dielectric 66. The gate spacers 87 may be formed of silicon nitride, silicon oxynitride, silicon carbide, silicon carbonitride, the like, or a combination thereof, and may be formed using, e.g., a thermal oxidation, CVD, or other suitable deposition process.

The shapes and formation methods of the gate spacers 87 as illustrated in FIG. 6 are merely non-limiting examples, and other shapes and formation methods are possible. For example, the gate spacers 87 may include first gate spacers (not shown) and second gate spacers (not shown). The first gate spacers may be formed on the opposing sidewalls of the dummy gate structure 75. The second gate spacers may be formed on the first gate spacers, with the first gate spacers disposed between a respective gate structure and the respective second gate spacers. The first gate spacers may have an L-shape in a cross-sectional view. As another example, the gate spacers 87 may be formed after the epitaxial source/drain regions 80 (see FIG. 7) are formed. In some embodiments, dummy gate spacers are formed on the first gate spacers (not shown) before the epitaxial process of the epitaxial source/drain regions 80 illustrated in FIG. 7, and the dummy gate spacers are removed and replaced with the second gate spacers after the epitaxial source/drain regions 80 are formed. All such embodiments are fully intended to be included in the scope of the present disclosure.

Figure 7:
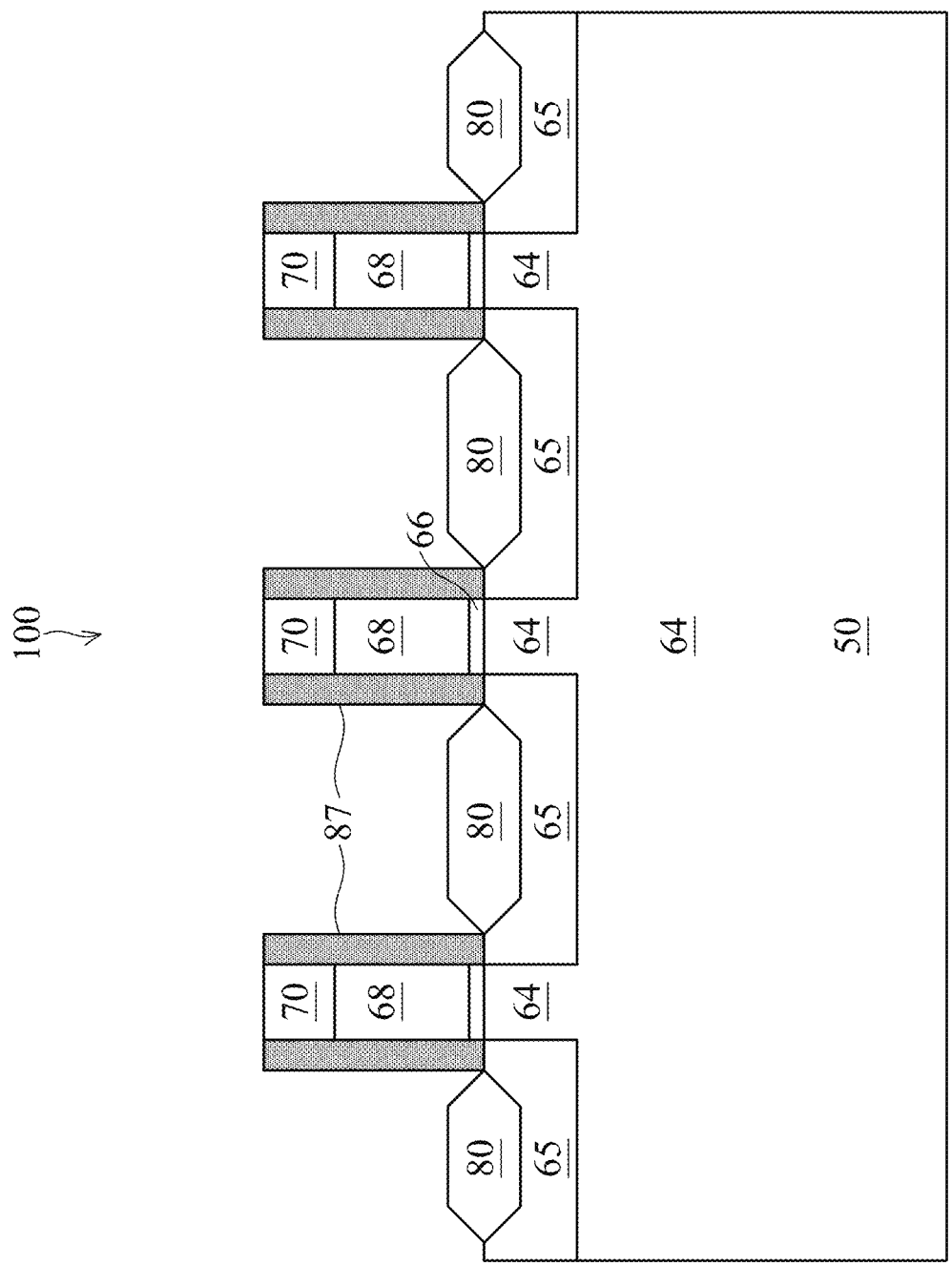

Next, as illustrated in FIG. 7, source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80. In some embodiments, the source/drain regions 80 of adjacent fins 64 do not merge together and remain separate source/drain regions 80. In some example embodiments in which the resulting FinFET is an n-type FinFET, source/drain regions 80 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET that are to be protected from the implanting process. The source/drain regions 80 may have an impurity (e.g., dopant) concentration in a range from about $1E19$ $cm^{-3}$ to about $1E21$ $cm^{-3}$. In some embodiments, the epitaxial source/drain regions may be in situ doped during growth.

Figure 8:
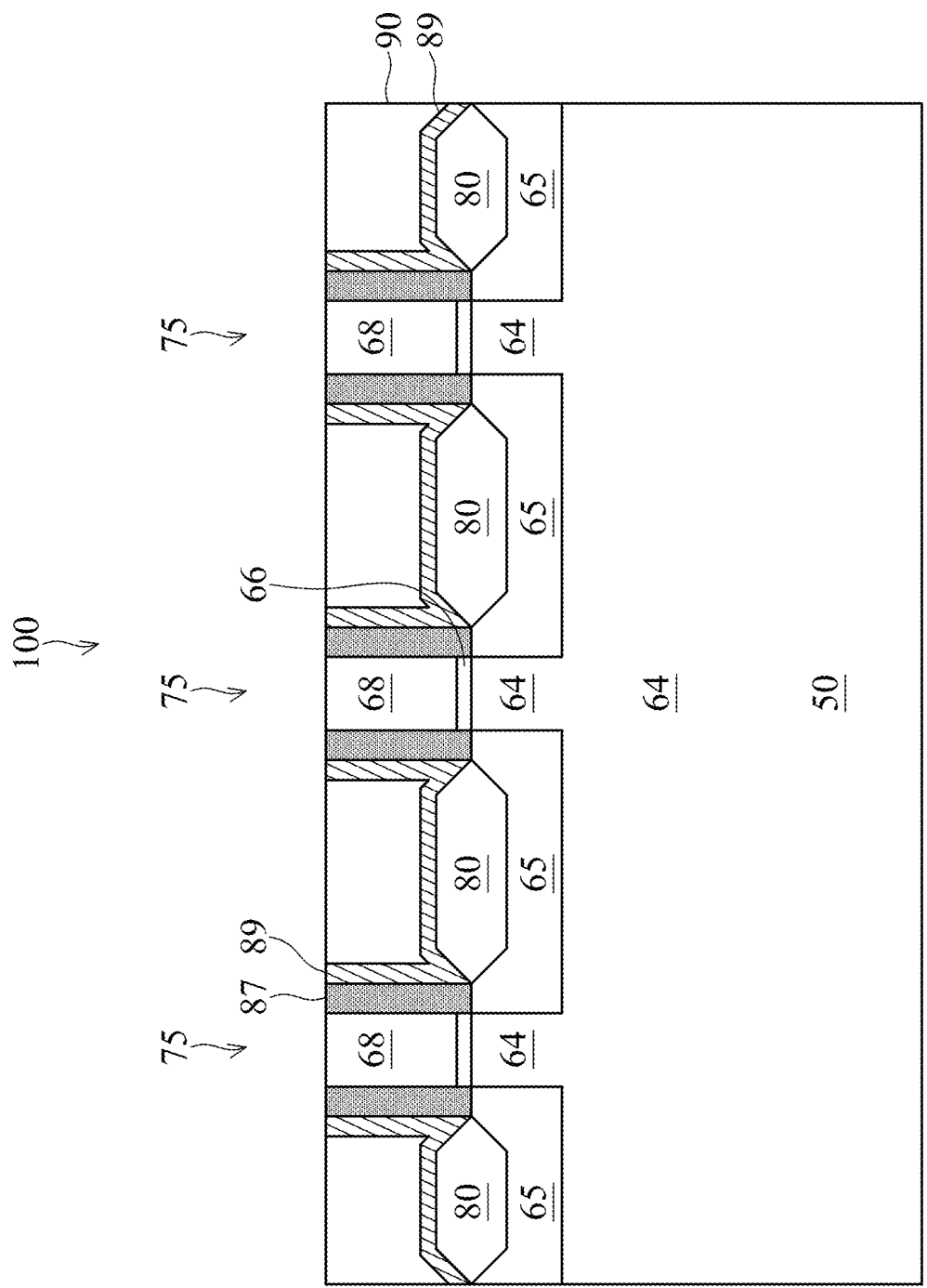

Next, as illustrated in FIG. 8, a contact etch stop layer (CESL) 89 is formed over the structure illustrated in FIG. 7. The CESL 89 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, a first interlayer dielectric (ILD) 90 is formed over the CESL 89 and over the dummy gate structures 75. In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as CMP, may be performed to remove the mask 70 and to remove portions of the CESL 89 disposed over the gate electrode 68. After the planarization process, the top surface of the first ILD 90 is level with the top surface of the gate electrode 68.

Figure 9:
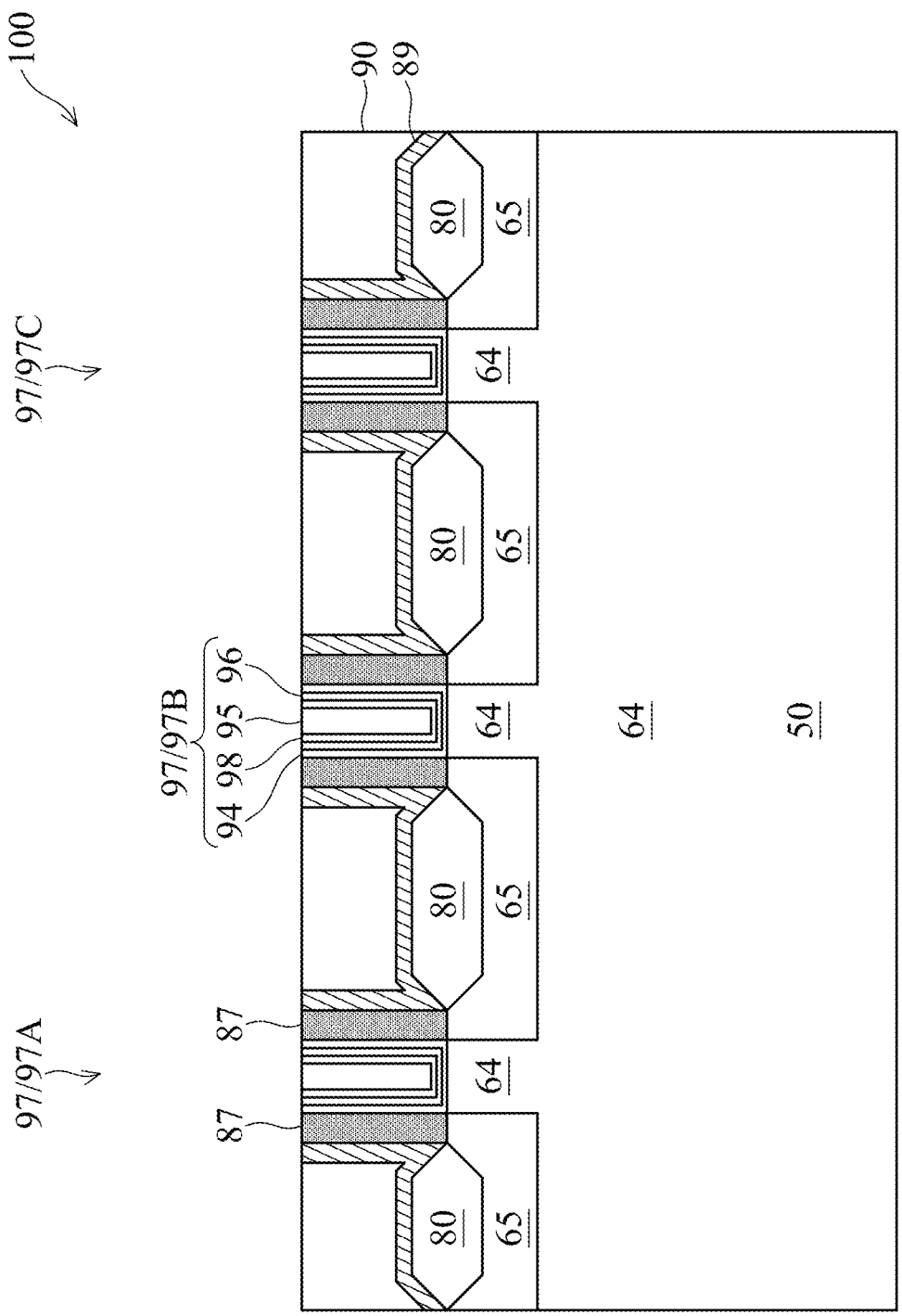

Next, in FIG. 9, a gate-last process (sometimes referred to as replacement gate process) is performed to replace the gate electrode 68 and the gate dielectric 66 with an active gate (may also be referred to as a replacement gate or a metal gate) and active gate dielectric material(s), respectively. Therefore, the gate electrode 68 and the gate dielectric 66 may be referred to as dummy gate electrode and dummy gate dielectric, respectively, in a gate-last process. The active gate is a metal gate, in some embodiments.

Referring to FIG. 9, the dummy gate structures 75 are replaced by replacement gate structures 97 (e.g., 97A, 97B, 97C). In accordance with some embodiments, to form the replacement gate structures 97, the gate electrode 68 and the gate dielectric 66 directly under the gate electrode 68 are removed in an etching step(s), so that recesses (not shown) are formed between the gate spacers 87. Each recess exposes the channel region of a respective fin 64. During the dummy gate removal, the gate dielectric 66 may be used as an etch stop layer when the gate electrode 68 is etched. The gate dielectric 66 may then be removed after the removal of the gate electrode 68.

Next, a gate dielectric layer 94, a barrier layer 96, a work function layer 98, and a gate electrode 95 are formed in the recesses for the replacement gate structure 97. The gate dielectric layer 94 is deposited conformally in the recesses, such as on the top surfaces and the sidewalls of the fins 64 and on sidewalls of the gate spacers 87, and on a top surface of the first ILD 90 (not shown). In accordance with some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value (e.g., dielectric constant) greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Next, the work function layer 98, such as a p-type work function layer or an n-type work function layer, may be formed in the recesses over the barrier layers 96 and before the gate electrode 95 is formed, in some embodiments. Exemplary p-type work function metals that may be included in the gate structures for p-type devices include TiN, TaN, Ru, Mo, Al, WN, ZrSi$_2$, MoSi$_2$, TaSi$_2$, NiSi$_2$, other suitable p-type work function materials, or combinations thereof. Exemplary n-type work function metals that may be included in the gate structures for n-type devices include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, a seed layer (not shown) is formed conformally over the work function layer 98. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer comprises a titanium layer and a copper layer over the titanium layer.

Next, the gate electrode 95 is deposited over the seed layer, and fills the remaining portions of the recesses. The gate electrode 95 may be made of a metal-containing material such as Cu, Al, W, the like, combinations thereof, or multi-layers thereof, and may be formed by, e.g., electroplating, electroless plating, or other suitable method. After the formation of the gate electrode 95, a planarization process, such as a CMP, may be performed to remove the excess portions of the gate dielectric layer 94, the barrier layer 96, the work function layer 98, the seed layer, and the gate electrode 95, which excess portions are over the top surface of the first ILD 90. The resulting remaining portions of the gate dielectric layer 94, the barrier layer 96, the work function layer 98, the seed layer, and the gate electrode 95 thus form the replacement gate structure 97 (also referred to as the metal gate structure) of the resulting FinFET device 100. As illustrated in FIG. 9, due to the planarization process, the metal gate structure 97, the gate spacers 87, the CESL 89, and the first ILD 90 have a coplanar upper surface.

Figure 10:
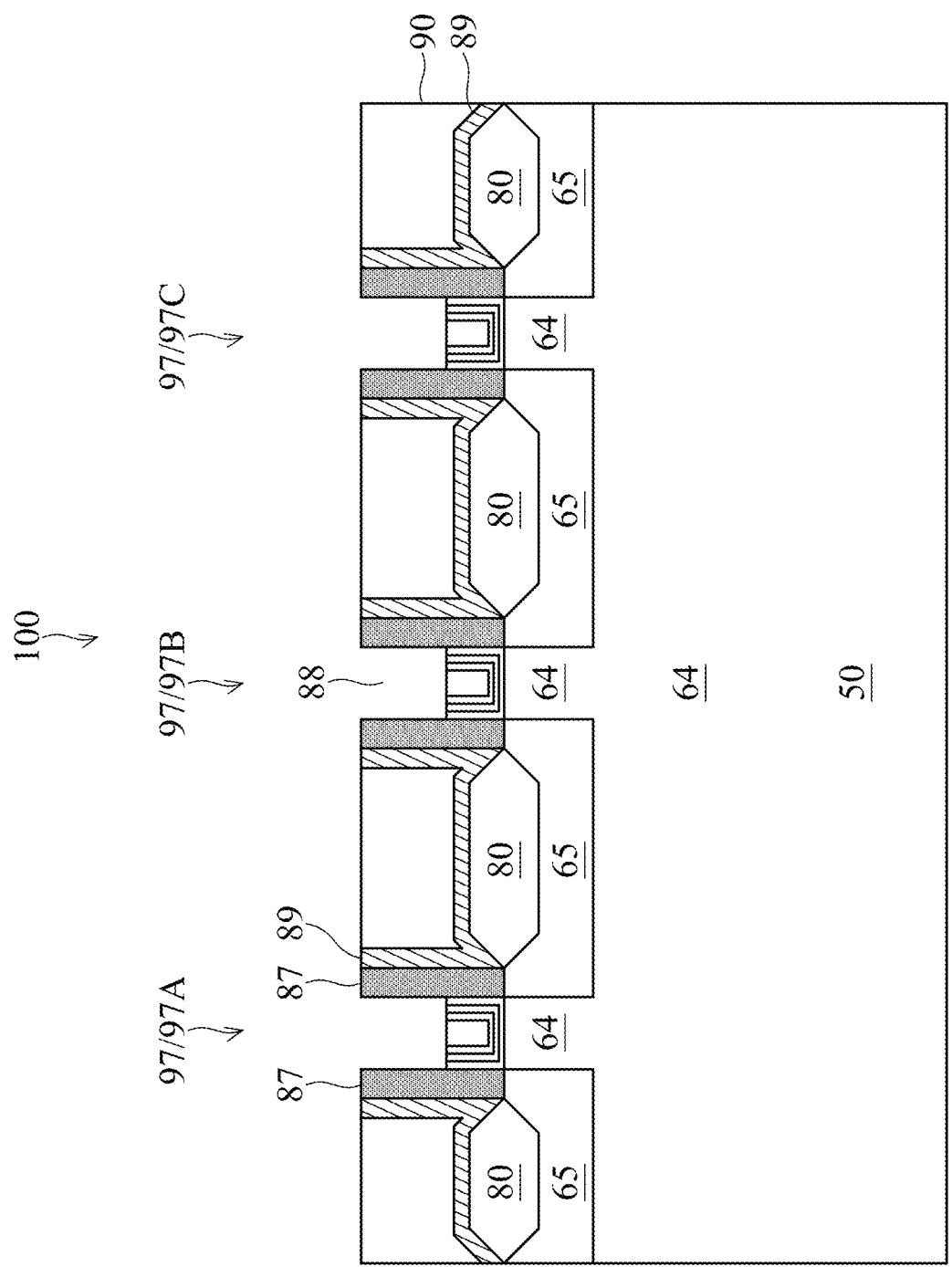

Next, in FIG. 10, a metal gate etch-back process is performed to remove upper portions of the metal gate structures 97, such that the metal gate structures 97 recess below the upper surface of the first ILD 90. Recesses 88 are formed between the gate spacers 87 after the metal gate etch-back process. A suitable etching process, such as dry etch, wet etch, or combinations thereof, may be performed as the metal gate etch-back process. An etchant for the etching process may be a halide (e.g., CCl$_4$), an oxidant (e.g., O$_2$), an acid (e.g., HF), a base (e.g., NH$_3$), an inert gas (e.g., Ar), combinations thereof, or the like, as examples.

Next, in FIG. 11, the gate spacers 87 and the CESL 89 are recessed below the upper surface of the first ILD 90. In some embodiments, an anisotropic etching process, such as a dry etch process, is performed to remove upper portions of the gate spacer 87. The CESL 89 may be removed by the same anisotropic etching process, if the CESL 89 and the gate spacers 87 comprise the same material, or have a same or similar etch rate for the anisotropic etching process. In some embodiments, the anisotropic etching process is performed using an etchant that is selective to (e.g., having a higher etch rate for) the material(s) of the gate spacers 87/CESL 89, such that the gate spacers 87/CESL 89 are recessed (e.g., upper portions removed) without substantially attacking the first ILD 90 and the metal gate structures 97. In embodiments where the gate spacers 87 and the CESL 89 have different etch rates, a first anisotropic etching process using a first etchant selective to the material of the gate spacers 87 may be performed to recess the gate spacers 87, and a second anisotropic etching process using a second etchant selective to the material of the CESL 89 may be performed to recess the CESL 89. Upper surfaces of the recessed gate spacers 87 and upper surfaces of the recessed CESL 89 may be level with the respective upper surfaces of the metal gate structures 97. In some embodiments, the CESL 89 is recessed after the capping layer 91 (discussed below) is formed.

Next, the metal gate structures 97 are recessed again, e.g., using the same or similar metal gate etch-back process discussed above, such that the upper surfaces of the metal gate structures 97 are lower (e.g., closer to the substrate) than the upper surfaces of the gate spacers 87. Next, a capping layer 91 is formed on the upper surfaces of the metal gate structures 97 to protect the metal gates structures 97, e.g., from oxidization and/or subsequent etching processes. The capping layer 91 is formed of a conductive material (e.g., metal), and is formed selectively on the upper surfaces of the metal gate structures 97, in the illustrated example. The capping layer 91 may be formed of, e.g., tungsten, although other suitable conductive material may also be used. A suitable formation method, such as CVD, PVD, ALD, or the like, may be used to form the capping layer 91. Note that in the discussion herein, unless otherwise specified, a conductive material refers to an electrically conductive material, and a conductive feature (e.g., a conductive line) refers to an electrically conductive feature.

Figure 11:
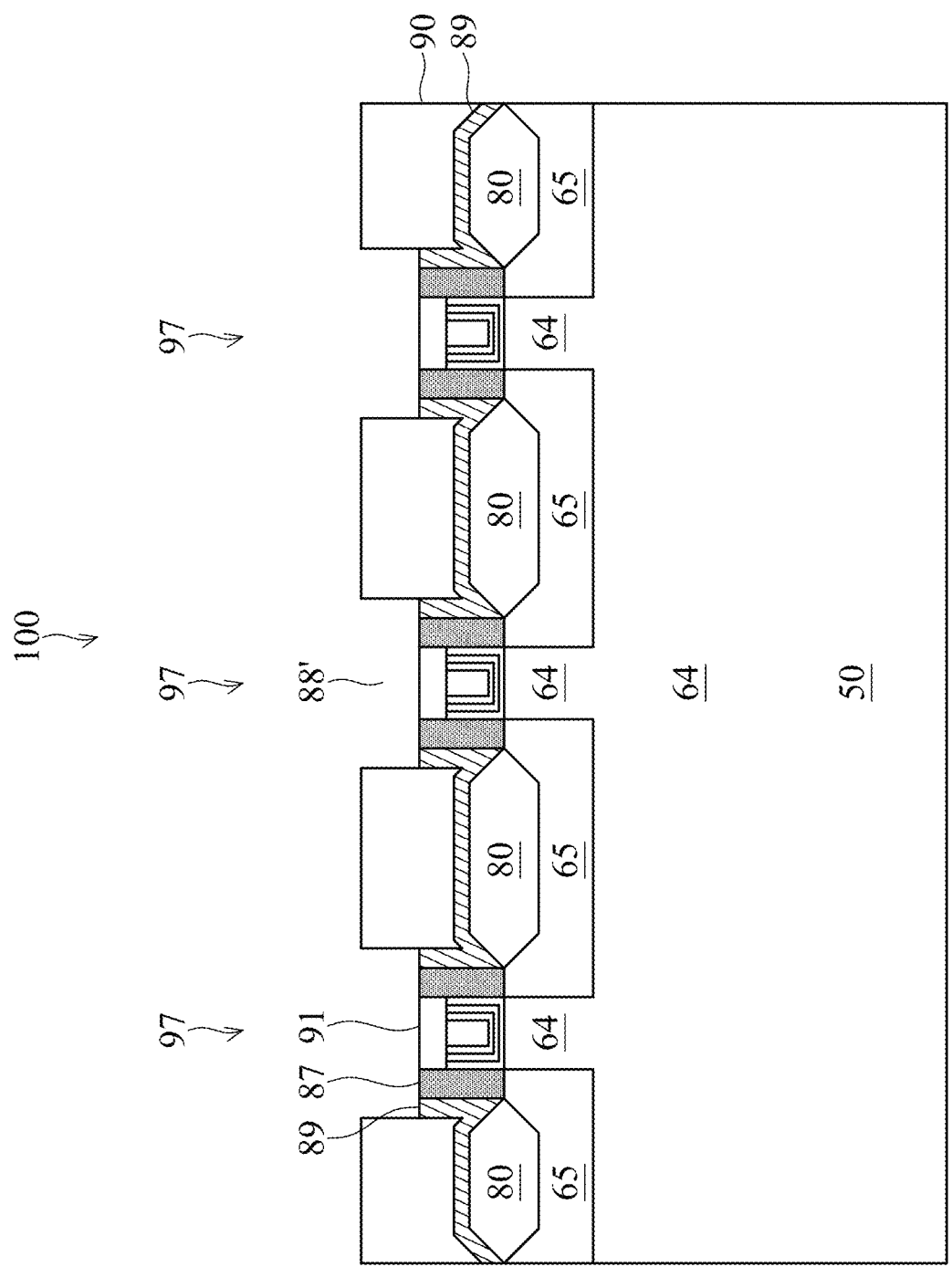

In the example of FIG. 11, the capping layer 91, the recessed gate spacers 87, and the recessed CESL 89 have a level (e.g., coplanar) upper surface. In other embodiments, there are offsets (e.g., vertical distances) among the upper surfaces of the capping layer 91, the recessed gate spacers 87, and the recessed CESL 89. Due to the recessing of the gate spacers 87 and the CESL 89, the recesses 88 in FIG. 10 are expanded and are denoted as recesses 88' in FIG. 11.

Figure 12:
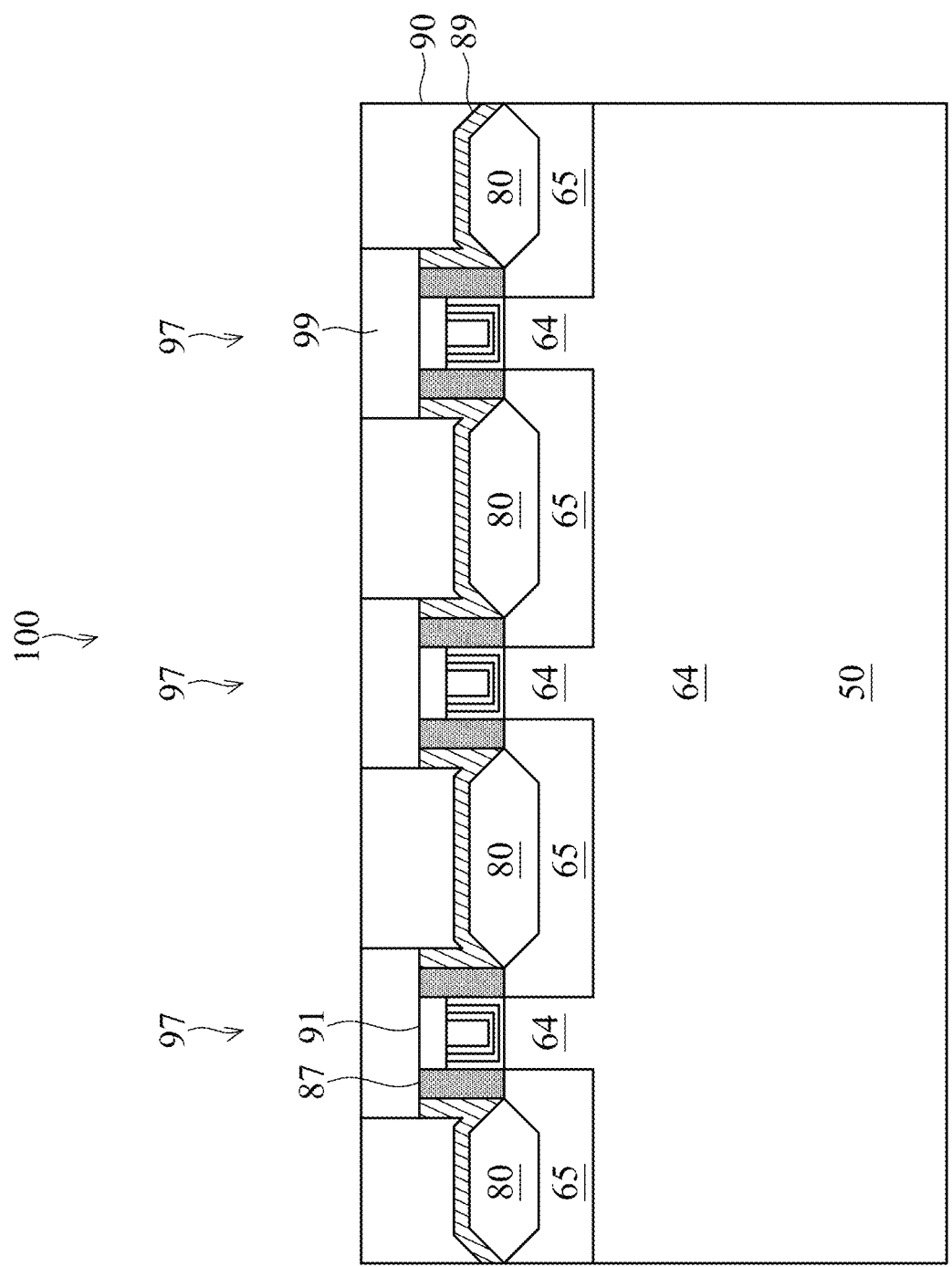

Next, in FIG. 12, a dielectric material 99 is formed to fill the recesses 88', and a planarization process, such as CMP, may be performed next to remove excess portions of the dielectric material 99 from the upper surface of the first ILD 90. In an embodiment, the dielectric material 99 is a nitride (e.g., silicon nitride, silicon oxynitride, silicon carbonitride). The dielectric material 99 may be formed using any suitable formation method such as CVD, PECVD, or the like. The dielectric material 99 protects the underlying structures, such as the metal gate structure 97, the gate spacers 87, and portions of the underlying CESL 89 from a subsequent etching process(es) for forming source/drain contacts. Details are discussed hereinafter.

Figure 13:
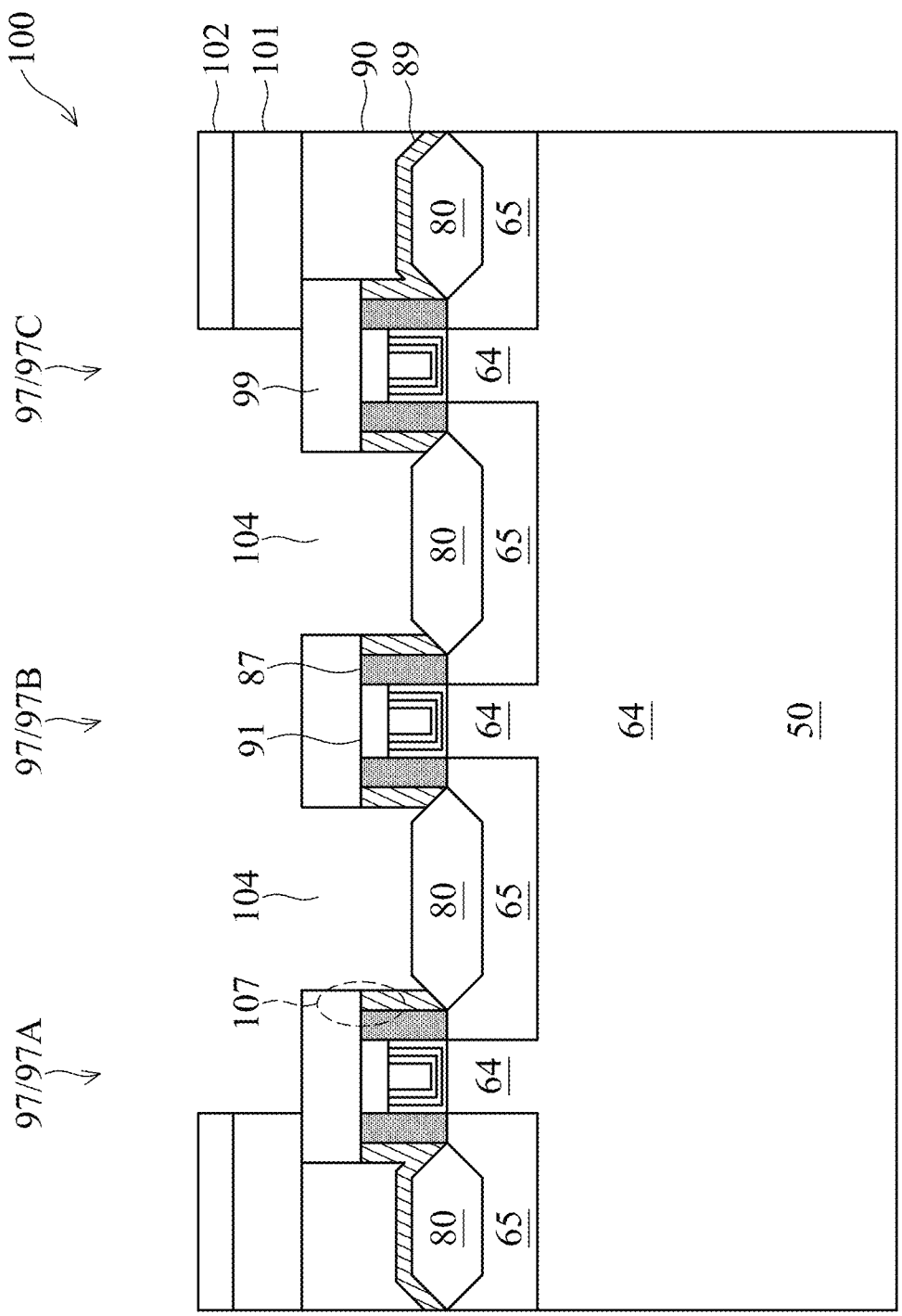

Next, in FIG. 13, a dielectric layer 101 is formed over the first ILD 90, and a patterned mask layer 102, such as a patterned photoresist, is formed over the dielectric layer 101. The dielectric layer 101 may comprise a same or similar material as the first ILD 90 and may be formed of a same or similar formation method as the first ILD 90, thus details are not repeated. In the example of FIG. 13, an opening in the patterned mask layer 102 is over (e.g., directly over) some of the source/drain regions 80 and over (at least portions of) the dielectric material 99.

Next, an etching process is performed to remove portions of the first ILD 90 and portions of the dielectric layer 101 that underlie the opening of the patterned mask layer 102. The etching process may be an anisotropic etching process, such as a reactive ion etch (RIE), an atomic layer etch (ALE), or the like. The etching process may use an etchant that is selective to (e.g., having a higher etch rate for) the material(s) of the first ILD 90 and the dielectric layer 101. As illustrated in FIG. 13, after the etching process, openings 104 are formed in the first ILD 90, such as between opposing sidewalls of the CESL 89 and over source/drain regions 80.

The openings 104 expose the underlying source/drain regions 80. The openings 104 are used to form self-aligned source/drain contacts 109 (see FIG. 14) in subsequently processing. The number and the locations of the openings 104 in FIG. 13 are merely non-limiting examples, one skilled in the art will readily appreciate that any numbers of the openings 104 may be formed, and the locations of the openings 104 may be at any suitable locations.

The dielectric material 99 protects (e.g., shields) the underlying structures, such as the gate spacers 87 and the CESL 89, from the anisotropic etching process to form the openings 104. It is observed that during manufacturing, corner regions 107 of the gate spacers 87/CESL 89 tend to be etched away at a faster rate than other regions of the gate spacers 87/CESL 89, resulting in the "shoulder loss" problem. The shoulder loss problem may be caused by the decreased etching selectivity between the material(s) of the gate spacers 87/CESL 89 and the material(s) of the first ILD 90/dielectric layer 101, which decreased etching selectivity may be a result of decreasing critical dimension (CD) in advanced semiconductor manufacturing. If the shoulder loss problem cause the metal gate structure 97 to be exposed, electrical short between the metal gate structure 97 and the adjacent source/drain region 80 may occur, when the openings 104 are filled with a conductive material in subsequent processing. The dielectric material 99 shields the gate spacers 87/CESL 89 from the anisotropic etching process, thus reducing or preventing occurrence of the shoulder loss, which in turn reduces or prevents device failure caused by electrical short between the metal gate structures 97 and the source/drain regions 80.

Figure 14:
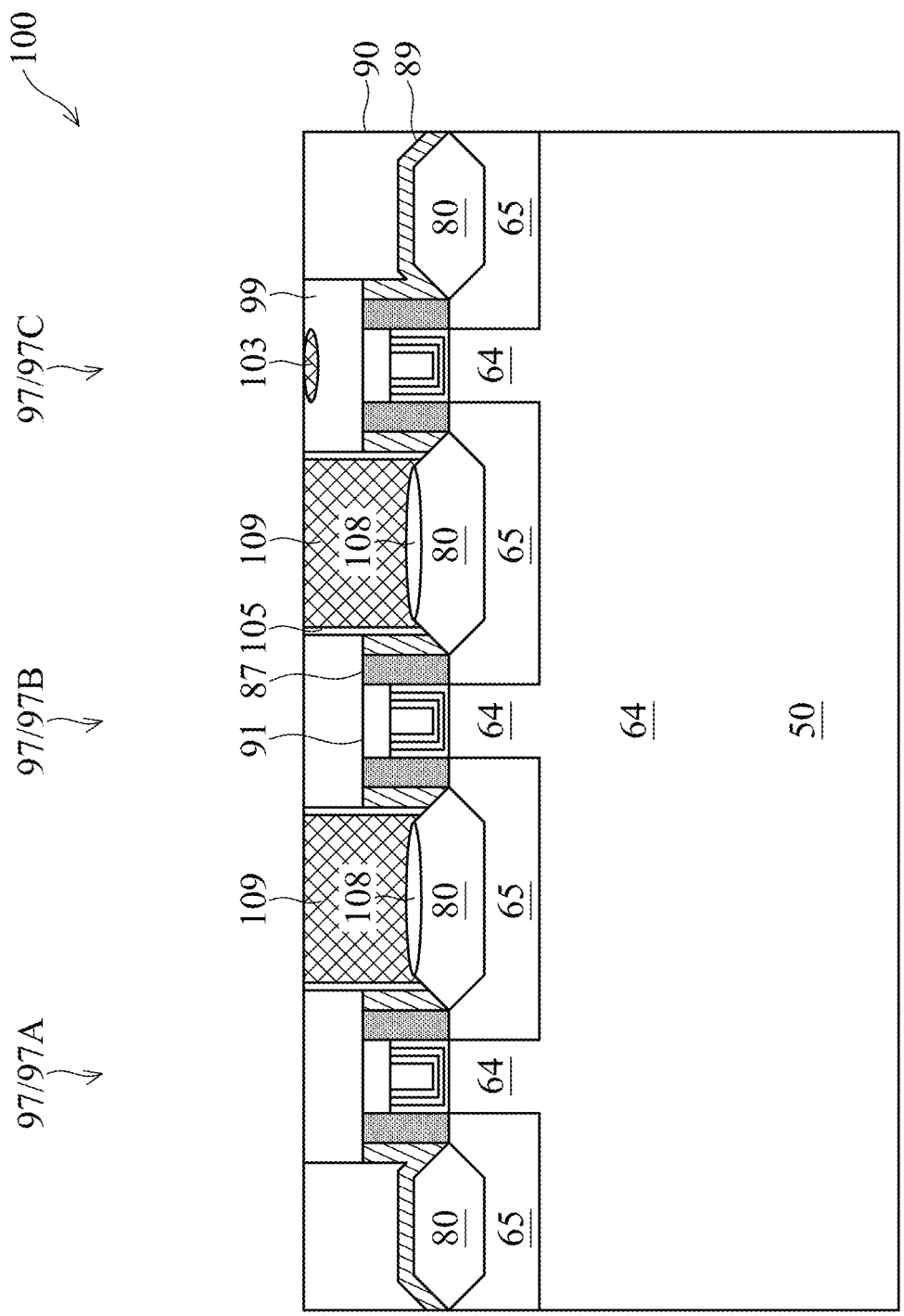

Next, in FIG. 14, a barrier layer 105 is formed conformally over the structure of FIG. 13. The barrier layer 105 may comprise titanium, tantalum, titanium nitride, tantalum nitride, or the like, and may be formed using a suitable formation method such as ALD, CVD, or the like. In some embodiments, the barrier layer 105 is formed to line sidewalls and bottoms of the openings 104.

Next, silicide regions 108 are formed over the source/drain regions 80 exposed by the openings 104. The silicide regions 108 may be formed by first depositing a metal layer capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the source/drain regions 80, then performing a thermal anneal process to form the silicide regions 108. In some embodiments, the un-reacted portions of the deposited metal layer are removed, e.g., by an etching process after the thermal anneal process. Although regions 108 are referred to as silicide regions, the regions 108 may also be germanide regions, or silicon germanide regions (e.g., regions comprising silicide and germanide). In an example embodiment where the barrier layer 105 comprises a suitable metal material such as titanium or tantalum, the silicide regions 108 are formed by performing a thermal anneal process after the barrier layer 105 is formed, such that portions of the barrier layer 105 at the bottoms of the openings 104 (e.g., on the source/drain regions 80) react with the source/drain regions 80 to form silicide regions 108.

Next, a conductive material, such as titanium, cobalt, or the like, is formed to fill the openings 104 using a suitable formation methods, such as PVD, CVD, ALD, plating, and the like. Next, a planarization process, such as CMP, is performed to remove the patterned mask layer 102, the dielectric layer 101, and portions of the conductive material disposed outside the openings 104. The remaining portions of the conductive material in the openings 104 form self-aligned source/drain contacts 109. For simplicity, the self-aligned source/drain contacts 109 may also be referred to as source/drain contacts 109.

FIG. 14 further illustrates a metal region 103 over, e.g., the upper surface of dielectric material 99. The metal region 103 (may also be referred to as a metal layer) is a residue portion of the conductive material of the source/drain contacts 109 that is not removed by the planarization process. In other words, the metal region 103 and the source/drain contacts 109 are formed of a same conductive material, in some embodiments. The metal region 103 may be formed due to, e.g., the upper surface of the dielectric material 99 not being perfectly flat (e.g., having divots), and therefore, the conductive material of the source/drain contacts 109 is deposited into the divots and was not removed by the planarization process. The metal region 103 ideally should not exist. However, if the planarization process is insufficient and the metal region 103 remain on the dielectric material 99, a subsequent etching process to form via holes through the dielectric material 99 may be stopped prematurely by the metal region 103, thereby causing device failure. The present disclosure discloses a multi-step etching process to ensure that via holes will be formed properly regardless of whether the metal region 103 exists. Details are discussed hereinafter. Note that the number and the location of the metal region 103 in FIG. 14 are for illustration purpose only and not limiting.

Figure 15:
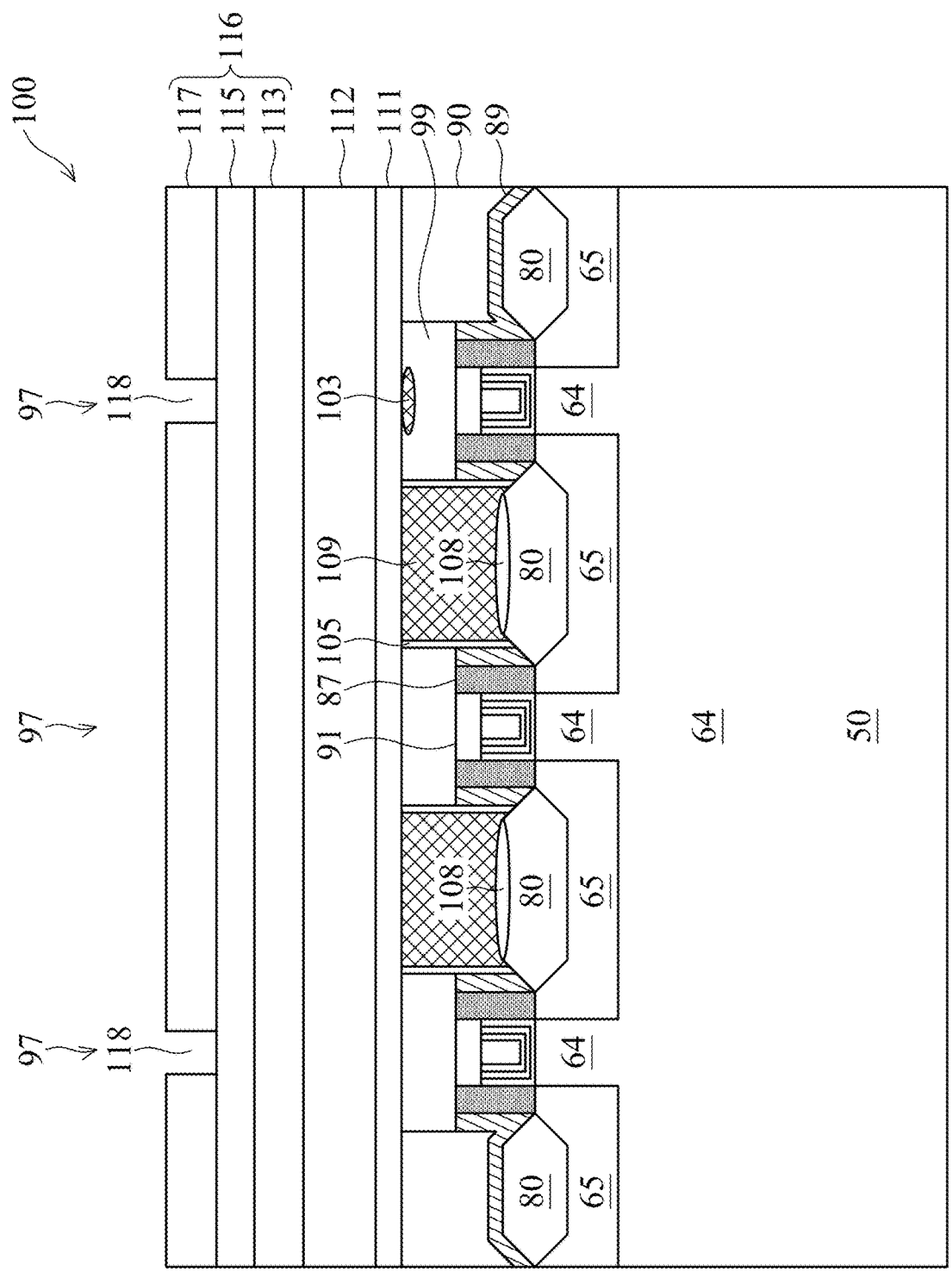

Next, in FIG. 15, an etch stop layer 111, a dielectric layer 112, and a tri-layered photoresist 116 are formed successively over the first ILD 90. The etch stop layer 111 is formed of suitable material, e.g., silicon nitride, silicon carbide, silicon carbonitride, or the like, by a suitable formation methods such as CVD, PECVD, ALD, or the like. The dielectric layer 112 may comprise a same or similar material as the first ILD 90, and may be formed of a same or similar formation method, thus details are not repeated.

In some embodiments, the tri-layered photoresist 116 includes a top photoresist layer 117, a middle layer 115, and a bottom anti-reflective coating (BARC) layer 113. The BARC layer 113 of the tri-layered photoresist 116 may comprise an organic or inorganic material. The middle layer 115 may comprise silicon nitride, silicon oxynitride, or the like, that has an etch selectivity to the top photoresist layer 117, such that the top photoresist layer 117 can be used as a mask layer to pattern the middle layer 115. The top photoresist layer 117 may comprise a photosensitive material. Any suitable deposition method, such as PVD, CVD, spin coating, the like, or combinations thereof, may be used to form the tri-layered photoresist 116.

Once the tri-layered photoresist 116 is formed, patterns 118 (also referred to as openings 118) are formed in the top photoresist layer 117, e.g., using photolithography and etching techniques. The patterns 118 are formed over (e.g., directly over) metal gate structures 97, in the illustrated embodiment.

Figure 16:
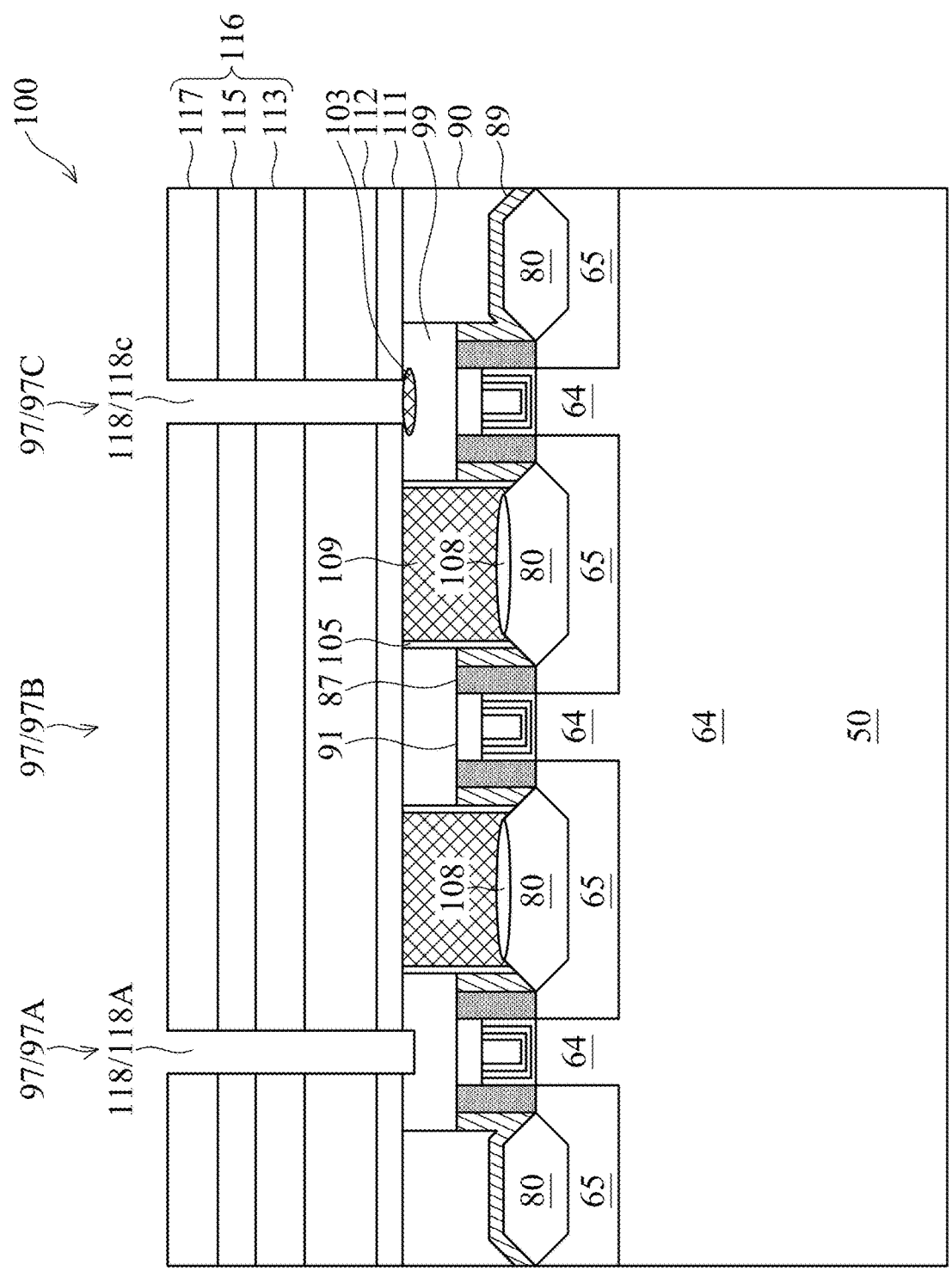

Next, in FIG. 16, the patterns 118 (e.g., 118A, 118C) in the top photoresist layer 117 are extended through the middle layer 115 and the BARC layer 113, and are transferred to the underlying layers (e.g., the dielectric layer 112, the etch stop layer 111, the dielectric material 99) using an anisotropic etching processes, such as a first dry etch process. In the example of FIG. 16, the opening 118A over the metal gate structure 97A extends through the dielectric layer 112, through the etch stop layer 111, and into the dielectric material 99. In other words, after the first dry etch process, the bottom of the opening 118A is between the upper surface and the lower surface of the dielectric material 99. Note that the opening 118C over the metal gate structure 97C extends through the dielectric layer 112, through the etch stop layer 111, but stops at (e.g., exposes) the metal region 103, due to, e.g., the etching selectivity between the dielectric layer 112/etch stop layer 111 and the metal region 103. In other words, the metal region 103 prevents the first dry etch process from reaching a target depth for the opening 118C.

In some embodiments, the first dry etch process is a first plasma process (also referred to as a plasma etch process) performed using a process gas comprising $C_4F_6$, $C_4F_8$, $CH_2F_2$, or combinations thereof. A carrier gas, such as $N_2$ or He, may be used to carry the process gas into the process chamber. In accordance with some embodiments, the first plasma process is a direct plasma process, with the plasma being generated in the same process chamber where the FinFET device 100 is treated. The first plasma process is performed using both a High-Frequency Radio-Frequency (HFRF) power (e.g., with a frequency about 60 MHz) and a Low-Frequency Radio-Frequency (LFRF) power (e.g., with a frequency of about 2 MHz). The HFRF power is used for ionization and to generate plasma, and the LFRF power (also referred to as bias power) is used for bombarding the layers (e.g., 112, 111, and 99) for removal. In accordance with some embodiments of the present disclosure, the HFRF power of the first plasma process is in the range between about 50 watts and about 400 watts, and the LFRF power of the first plasma process is between about 400 watts and about 600 watts. In some embodiments, the range of the LFRF power (e.g., between 400 watts and about 600 watts) is chosen to provide a target level of etching capability (e.g., etch rate) for the dielectric layer 112, to maintain a target level of etching selectivity between the dielectric layer 112 (e.g., silicon oxide) and the dielectric material 99 (e.g., silicon nitride), and to avoid under-etch during the first dry etch process.

Figure 17:
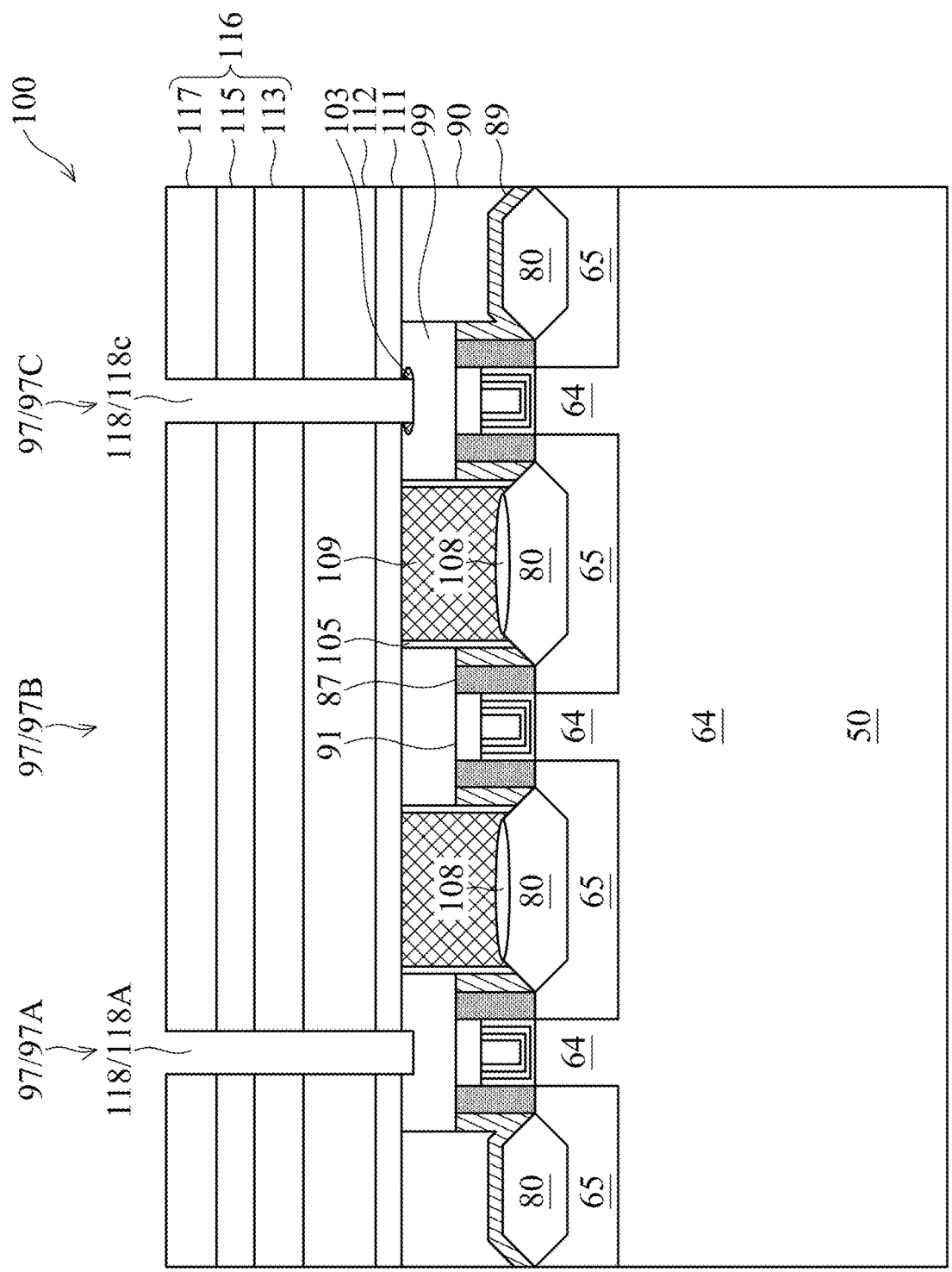

Next, in FIG. 17, a wet etch process (also referred to as a wet cleaning process) is performed to clean the openings 118. In some embodiments, the wet etch process is performed using a wet clean chemical, which may be, e.g., a mixture of HCl and $H_2CO_3$ dissolved in water. The wet etch process removes residues and by-products (e.g., polymer) of the first dry etch process from the openings 118. The wet etch process also etches through the metal region 103 at the bottom of the opening 118C to expose the underlying dielectric material 99. In some embodiments, the wet cleaning chemical is selective to (e.g., having a higher etch rate for) the residues/by-products (e.g., polymer) of the first dry etch process and the metal region 103, such that the residues/by-products and the metal region 103 are removed (e.g., etched) without substantially attacking other layers/materials.

Figure 18:
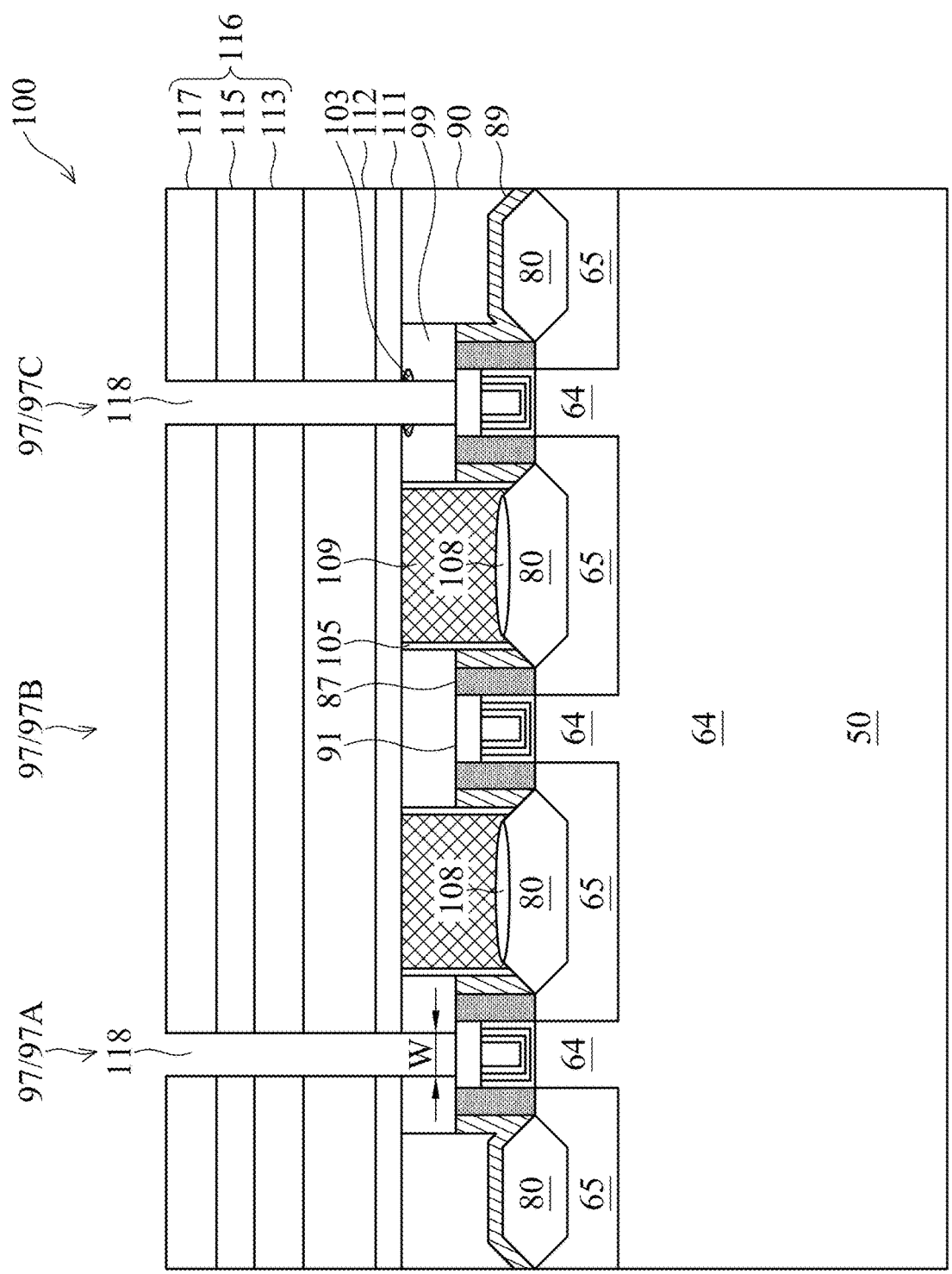

Next, in FIG. 18, a second dry etch process is performed to extend the openings 118 through the dielectric material 99 and to expose the capping layer 91. In some embodiments, the second dry etch process is a second plasma process performed using a process gas comprising $CH_2F_2$ and $H_2$. In some embodiments, the second plasma process is similar to the first plasma process of the first dry etch process, and the HFRF power of the second plasma process is in the range between about 50 watts and about 400 watts, and the LFRF power of the second plasma process is between about 0 watts and about 150 watts. In some embodiments, the LFRF power (e.g., less than about 150 watts) of the second plasma process is chosen to be smaller than the LFRF power of the first plasma process. The LFRF power of the second plasma process is chosen to provide a target level of etching capability (e.g., etch rate) for the dielectric material 99, to achieve a more uniform depth of the openings 118 in the dielectric material 99, and to avoid enlargement of the size (e.g., width W) of the openings 118. As illustrated in FIGS. 16-18, the multi-step etching process, which includes the first dry etch process, the wet etch process, and the second dry etch process, ensures that via holes (e.g., 118) are formed properly regardless of whether the metal region 103 exists.

Figure 19:
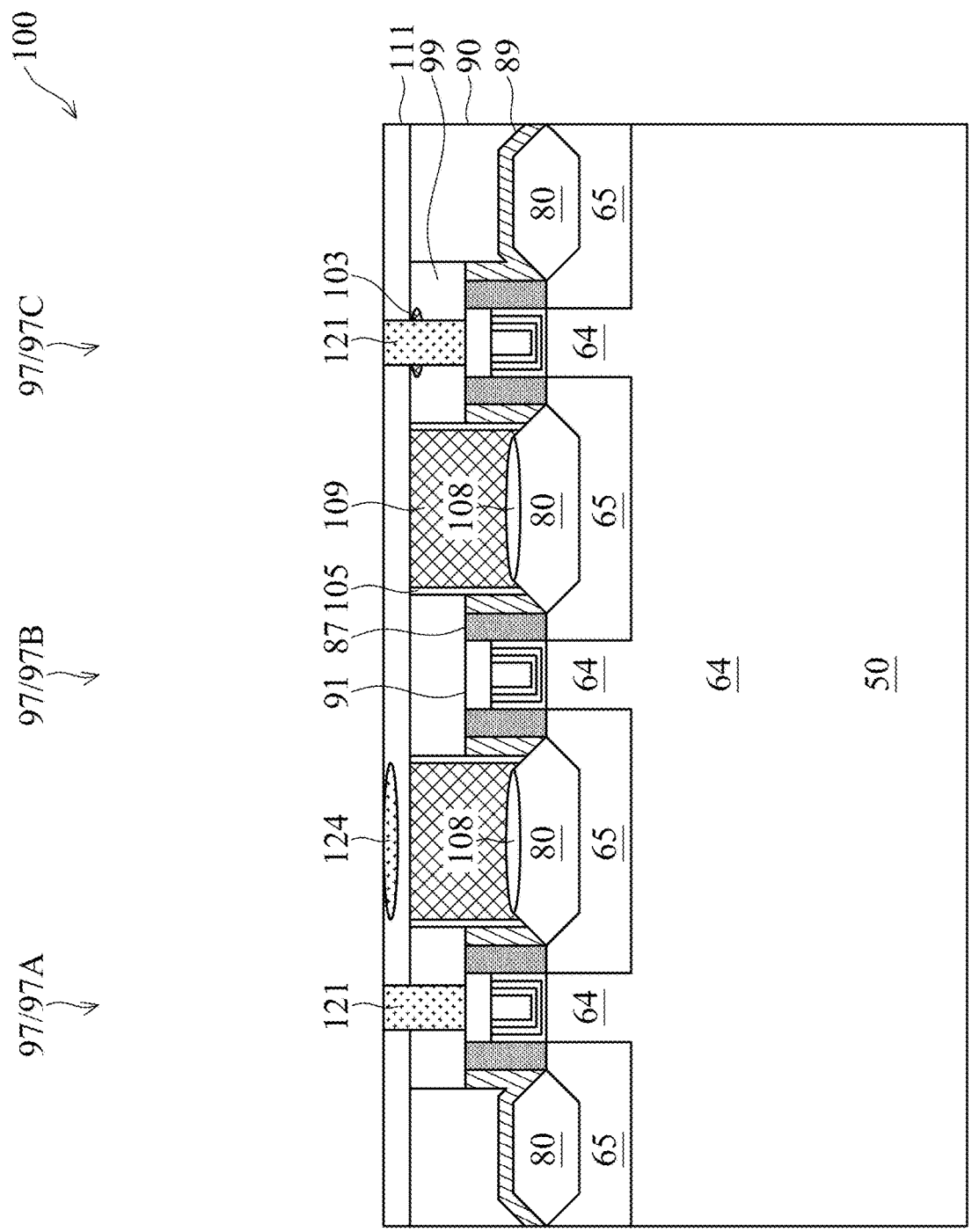

Next, in FIG. 19, the tri-layered photoresist 116 is removed (e.g., by an ashing process). Next, a conductive material 121 is formed to fill the openings 118. The conductive material may be, e.g., tungsten, titanium, or the like, and may be formed by a suitable formation method such as CVD, PECVD, ALD, or the like. Next, a planarization process, such as CMP, is performed to remove the dielectric layer 112, and portions of the conductive material 121 over the upper surface of the etch stop layer 111. In other words, the planarization process stops after the etch stop layer 111 is exposed. The remaining portions of the conductive material 121 form vias 121 that are over and electrically coupled to the metal gate structures 97. FIG. 19 further illustrate a metal region 124 on the upper surface of the etch stop layer 111. The metal region 124 may comprise residue portions of the conductive material 121 that are grinded away by the CMP process and deposited in a lower area at the upper surface of the etch stop layer 111. Note that the number and the location of metal region 124 in FIG. 19 are for illustration purpose only and not limiting The metal region 124 in FIG. 19 is directly over the source/drain contact 109. The metal region 124 may cause a subsequent etching process to form via holes (see, e.g., 128 in FIG. 21) to stop prematurely. The multi-step etching process same as or similar to those discussed above may be used to form vias holes properly, regardless of whether the metal region 124 exists. Details are discussed hereinafter.

Figure 20:
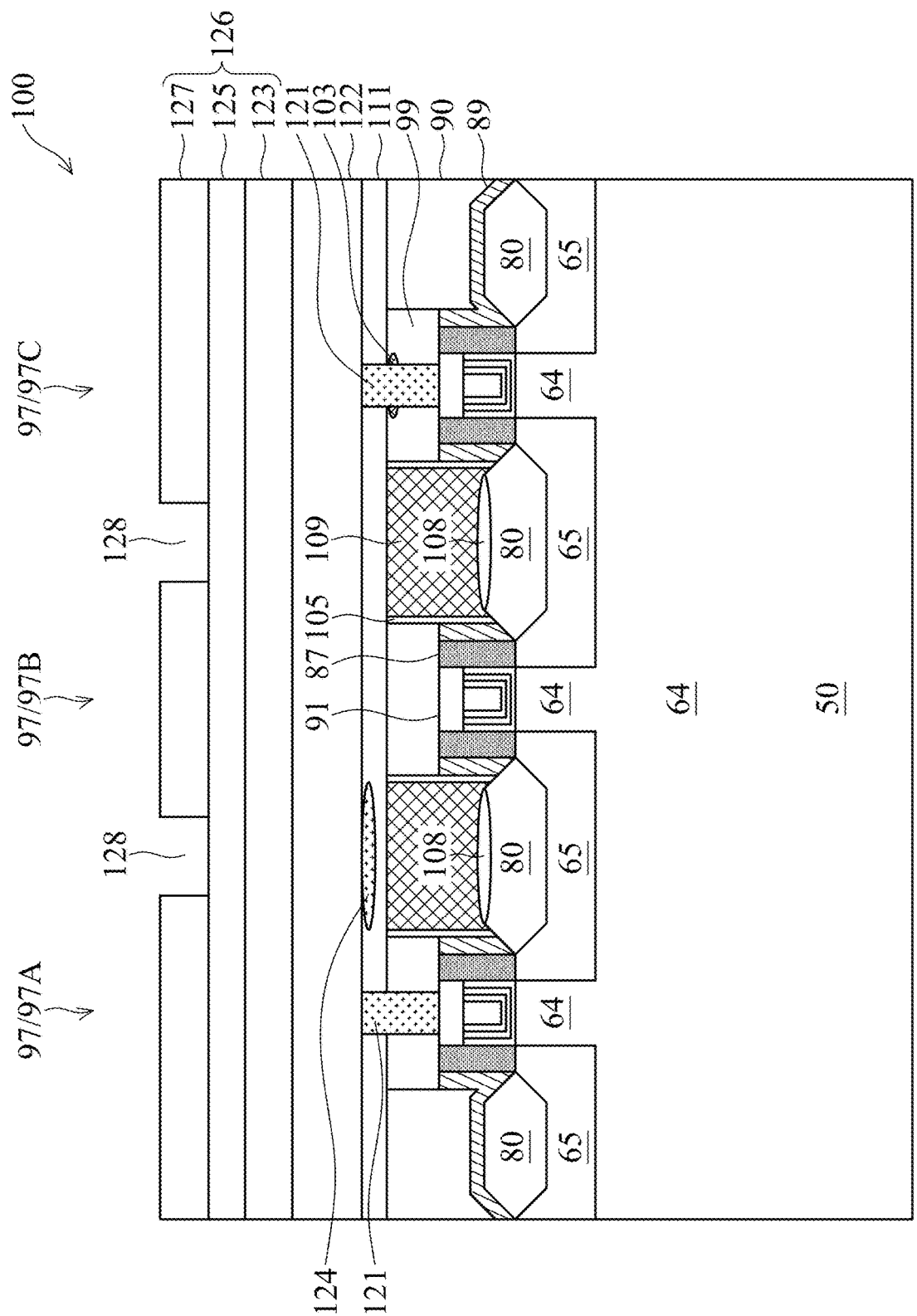

Next, in FIG. 20, a dielectric layer 122 and a tri-layered photoresist 126 are formed successively over the etch stop layer 111. The dielectric layer 122 and the tri-layered photoresist 126 may be same as or similar to the dielectric layer 112 and the tri-layered photoresist 116 of FIG. 18, thus details are not repeated.

As illustrated in FIG. 20, patterns 128 (also referred to as openings 128) are formed in the top photoresist layer 127 of the tri-layered photoresist 126, e.g., using photolithography and etching techniques. The patterns 128 are formed over (e.g., directly over) source/drain contacts 109, in the illustrated embodiment.

Figure 21:
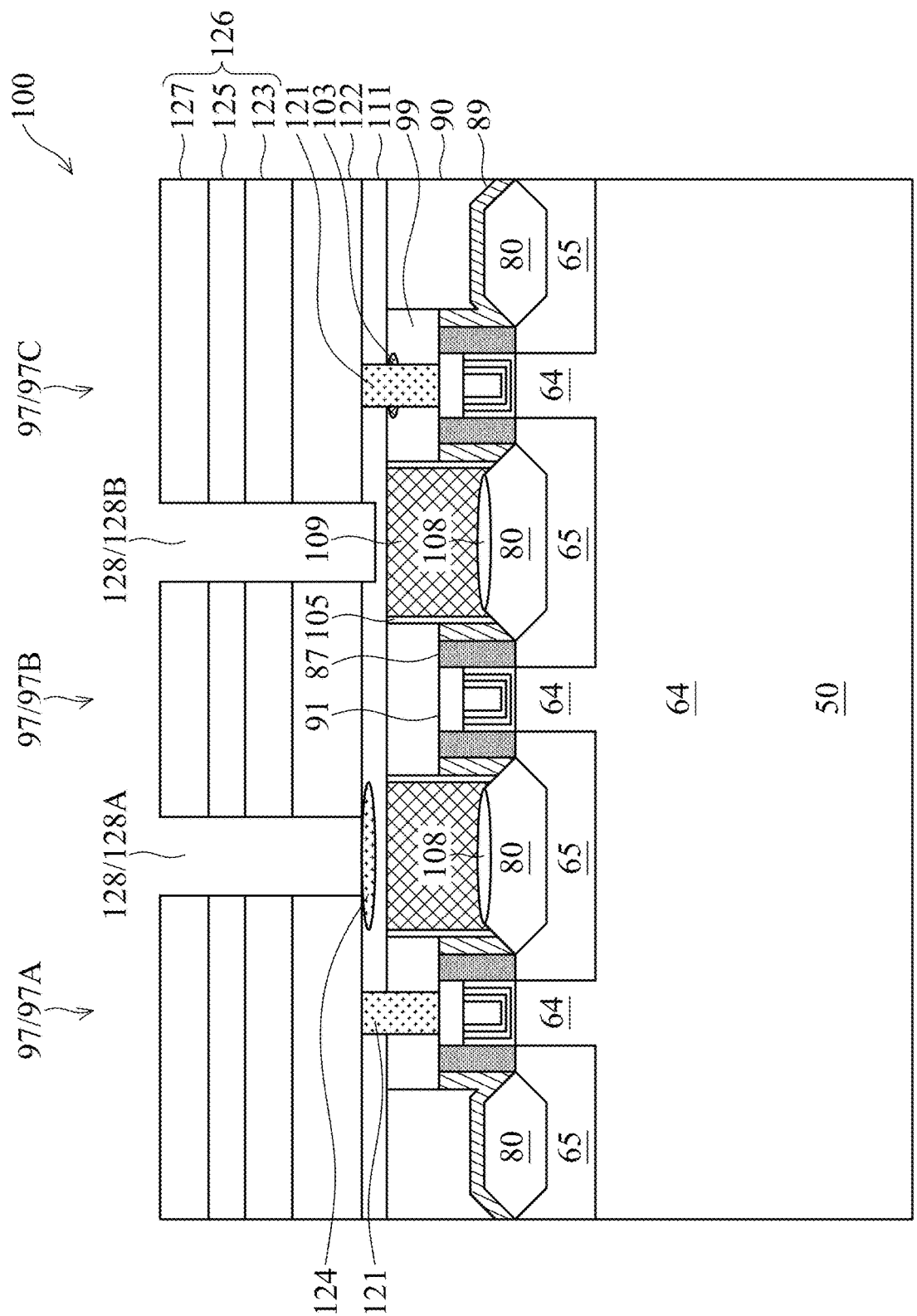

Next, in FIG. 21, the patterns 128 (e.g., 128A, 128B) in the top photoresist layer 127 are extended through the middle layer 125 and the BARC layer 123 of the tri-layered photoresist 126, and are transferred to the underlying layers (e.g., the dielectric layer 122, the etch stop layer 111) using the first dry etch process discussed above. In the example of FIG. 21, the opening 128B extends through the dielectric layer 122 and into the etch stop layer 111. In other words, after the first dry etch process, the bottom of the opening 128B is between the upper surface and the lower surface of the etch stop layer 111. Note that the opening 128A extends through the dielectric layer 122, but stops at (e.g., exposes) the metal region 124, due to, e.g., the etching selectivity between the dielectric layer 122 and the metal region 124.

Figure 22:
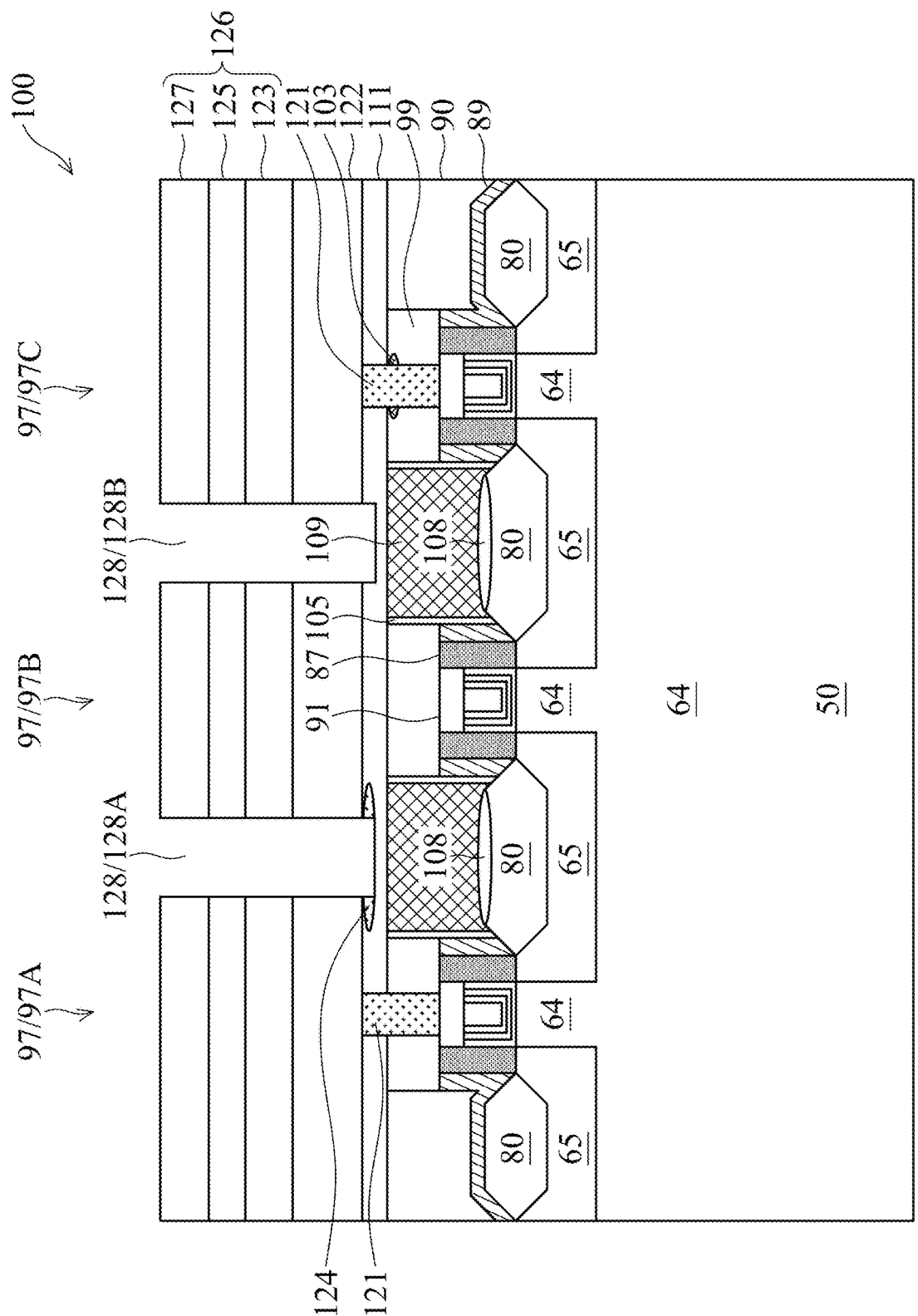

Next, in FIG. 22, the wet etch process described above is performed to clean the openings 128. The wet etch process removes residues and by-products (e.g., polymer) of the first dry etch process. The wet etch process also etches through the metal region 124 at the bottom of the opening 128A to expose the etch stop layer 111. In some embodiments, the wet cleaning chemical is selective to (e.g., having a higher etch rate for) the residues/by-products (e.g., polymer) of the first dry etch process and the metal region 124, such that the residues/by-products and the metal region 124 are removed (e.g., etched) without substantially attacking other layers/materials.

Figure 23:
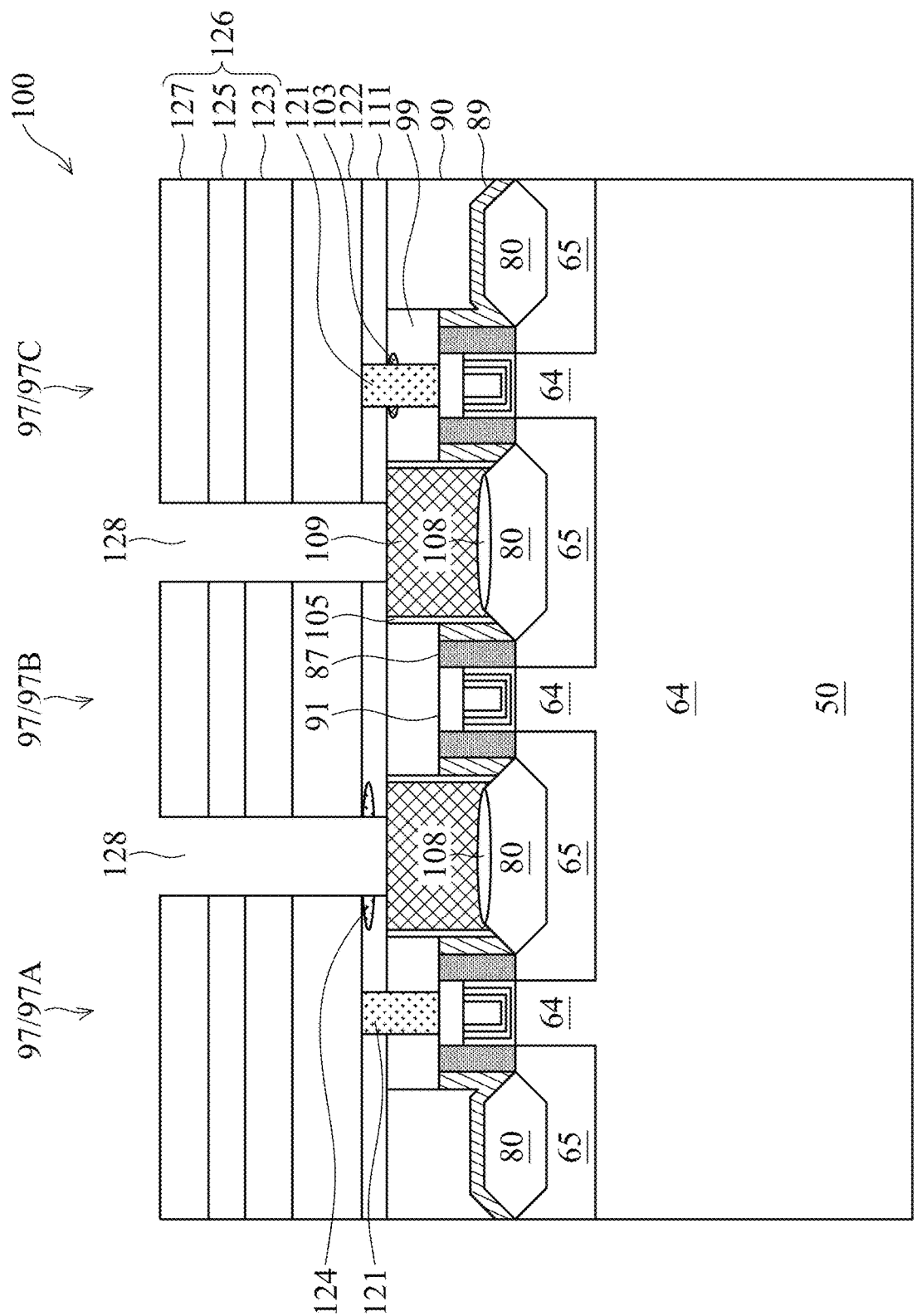

Next, in FIG. 23, the second dry etch process described above is performed to extend the openings 128 through the etch stop layer 111 and to expose the source/drain contacts 109. As illustrated in FIGS. 21-23, the multi-step etching process, which includes the first dry etch process, the wet etch process, and the second dry etch process, ensures that via holes (e.g., 128) are formed properly regardless of whether the metal region 124 exists.

Figure 24:
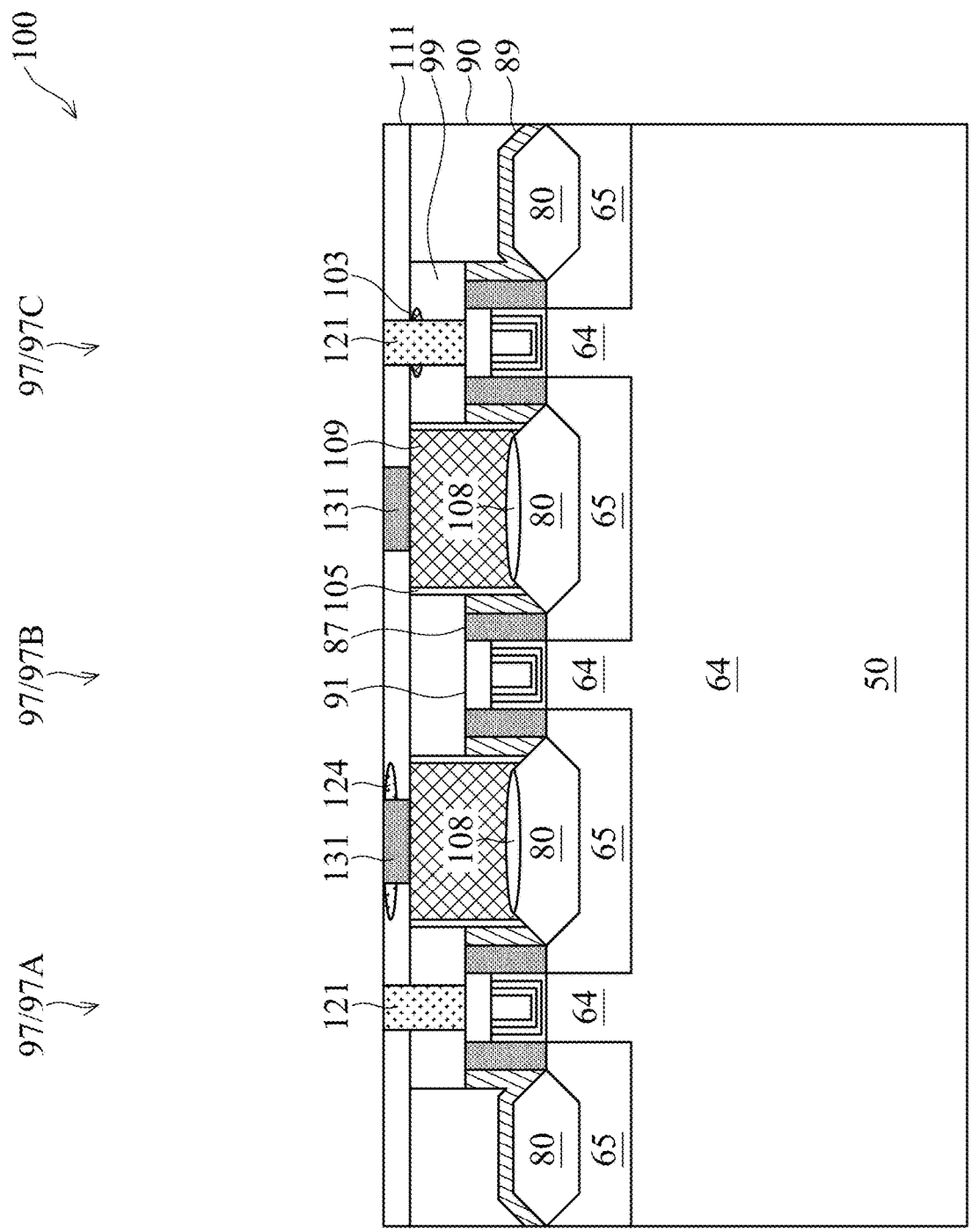

Next, in FIG. 24, a conductive material 131 is formed to fill the openings 128. The conductive material may be, e.g., tungsten, titanium, or the like, and may be formed by a suitable formation method such as CVD, PECVD, ALD, or the like. Next, a planarization process, such as CMP, is performed to remove the tri-layered photoresist 126, the dielectric layer 122, and portions of the conductive material 131 over the upper surface of the etch stop layer 111. The remaining portions of the conductive material 131 form vias 131 that are over and electrically coupled to the underlying source/drain contacts 109.

Additional processing may be performed after the processing of FIG. 24 to finish fabrication of the FinFET device 100. For example, an interconnect structure, which includes multiples dielectric layers and conductive features (e.g., vias, conductive lines) formed in the multiple dielectric layers, is formed over the structure of FIG. 24 to interconnect the underlying electrical components to form functional circuits. Details are not discussed here.

Embodiments may achieve advantages. For example, the multi-step etching process disclosed herein, which includes the first dry etch process, the wet etch process, and the second dry etch process, ensures that via holes (e.g., 118, 128) are formed properly regardless of whether the metal regions 103 or 124 exist. As a result, product defects caused by insufficient via hole etching is avoided or reduced.

Figure 25:
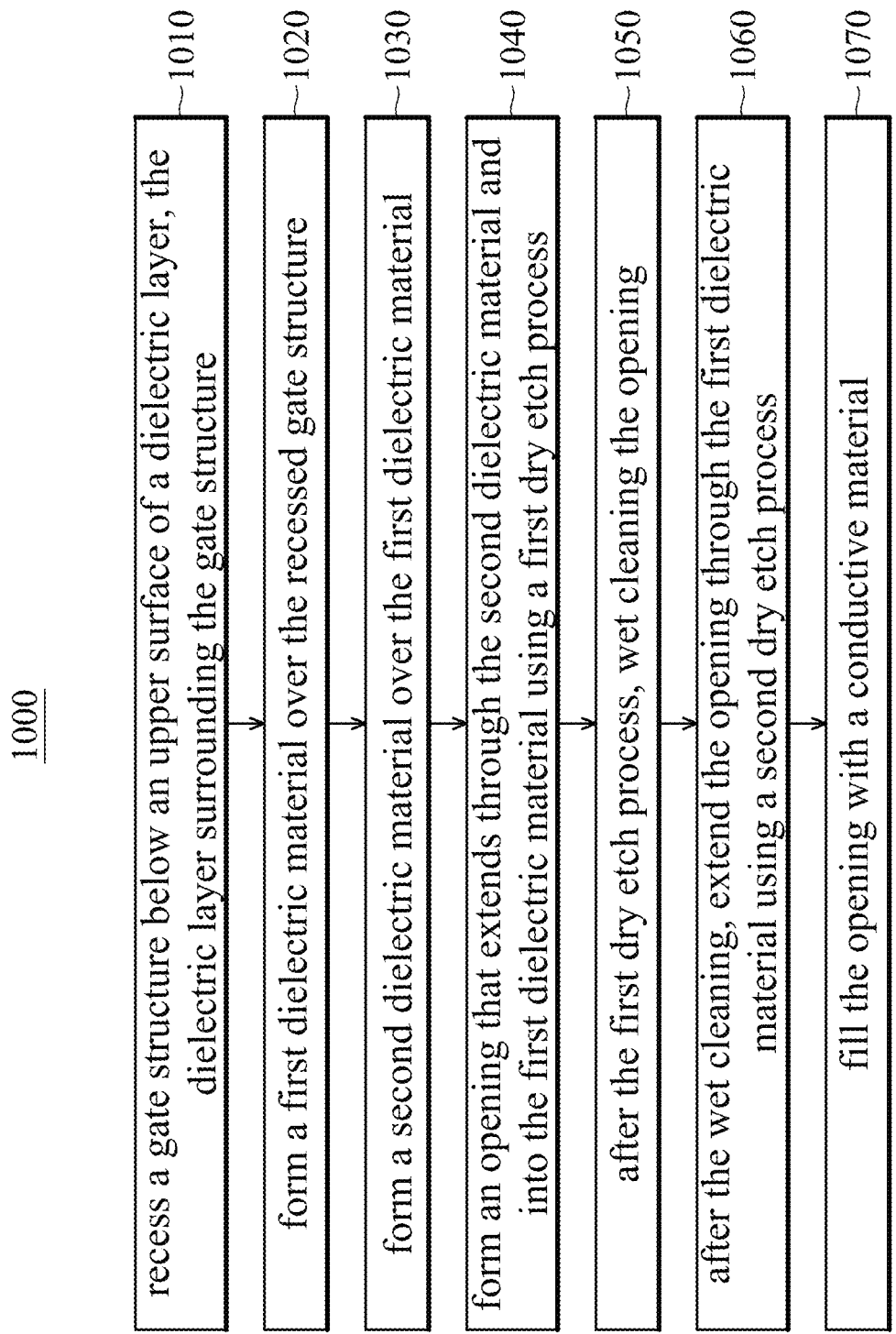
FIG. 25 illustrates a flow chart of a method of forming a semiconductor device, in accordance with some embodiments.

FIG. 25 illustrates a flow chart of a method 1000 of fabricating a semiconductor device, in accordance with some embodiments. It should be understood that the embodiment method shown in FIG. 25 is merely an example of many possible embodiment methods. One of ordinary skill in the art would recognize many variations, alternatives, and modifications. For example, various steps as illustrated in FIG. 25 may be added, removed, replaced, rearranged and repeated.

Referring to FIG. 25, at block 1010, a gate structure is recessed below an upper surface of a dielectric layer that surrounds the gate structure. At block 1020, a first dielectric material is formed over the recessed gate structure. At block 1030, a second dielectric material is formed over the first dielectric material. At block 1040, an opening is formed that extends through the second dielectric material and into the first dielectric material using a first dry etch process. At block 1050, after the first dry etch process, the opening is cleaned by a wet cleaning process. At block 1060, after the wet cleaning process, the opening is extended through the first dielectric material using a second dry etch process. At block 1070, the opening is filled with a conductive material.

In an embodiment, a method of forming a semiconductor device includes: forming a metal gate structure over a fin, the fin protruding above a substrate, the metal gate structure being surrounded by an interlayer dielectric (ILD) layer; recessing the metal gate structure below an upper surface of the ILD layer distal from the substrate; after the recessing, forming a first dielectric layer over the recessed metal gate structure; forming an etch stop layer over the first dielectric layer and the ILD layer; forming a second dielectric layer over the etch stop layer; performing a first dry etch process to form a first opening that extends through the second dielectric layer, through the etch stop layer, and into the first dielectric layer; after the first dry etch process, performing a wet etch process to clean the first opening; and after the wet etch process, performing a second dry etch process to extend the first opening through the first dielectric layer. In an embodiment, the method further includes, after the second dry etch process, filling the first opening with a conductive material. In an embodiment, an upper surface of the first dielectric layer is formed to be level with the upper surface of the ILD layer. In an embodiment, the method further includes, before forming the first dielectric layer, recessing gate spacers of the metal gate structure below the upper surface of the ILD layer, wherein the first dielectric layer is formed over the recessed gate spacers. In an embodiment, the first dry etch process is a first plasma process, and the second dry etch process is a second plasma process. In an embodiment the first plasma process is performed with a first bias power, and the second plasma process is performed with a second bias power different from the first bias power. In an embodiment, the second bias power is lower than the first bias power. In an embodiment, the first dielectric layer is formed of silicon nitride, and the second dielectric layer is formed of silicon oxide. In an embodiment, the first dry etch process is a first plasma process performed using a first process gas comprising $C_4F_6$, $C_4F_8$, or $CH_2F_2$, and the second dry etch process is a second plasma process performed using a second process gas comprising $CH_2F_2$ and $H_2$. In an embodiment, the wet etch process is performed using a wet clean chemical comprising HCl and $H_2CO_3$. In an embodiment, the method further includes, after forming the first dielectric layer and before forming the etch stop layer: removing a portion of the ILD layer adjacent to the metal gate structure to form a second opening in the ILD layer, the second opening exposing an underlying source/drain region; filling the second opening with a conductive material; and after the filling, performing a planarization process to remove portions of the conductive material disposed outside the second opening. In an embodiment, after the planarization process, a residue portion of the conductive material remains on an upper surface of the first dielectric layer, wherein the method further comprises: forming a third opening that extends through the second dielectric layer and the etch stop layer using the first dry etch process, wherein a bottom of the third opening exposes the residue portion of the conductive material; etching through the residue portion of the conductive material to expose the first dielectric layer using the wet etch process; and extending the third opening through the first dielectric layer using the second dry etch process.

In an embodiment, a method of forming a semiconductor device includes: recessing a gate structure below an upper surface of a dielectric layer, the dielectric layer surrounding the gate structure; forming a first dielectric material over the recessed gate structure; forming a second dielectric material over the first dielectric material; forming an opening that extends through the second dielectric material and into the first dielectric material using a first dry etch process; after the first dry etch process, wet cleaning the opening; after the wet cleaning, extending the opening through the first dielectric material using a second dry etch process; and filling the opening with a conductive material. In an embodiment, the first dry etch process is a first plasma process, and the second dry etch process is a second plasma process. In an embodiment, a first bias power of the first plasma process is higher than a second bias power of the second plasma process. In an embodiment, the first dielectric material is a nitride, and the second dielectric material is an oxide. In an embodiment, the first plasma process is performed using a first process gas comprising $C_4F_6$, $C_4F_8$, or $CH_2F_2$, the second plasma process is performed using a second process gas comprising $CH_2F_2$ and $H_2$, and the wet cleaning is performed using a wet clean chemical comprising HCl and $H_2CO_3$.

In an embodiment, a method of forming a semiconductor device includes: forming a gate structure over a fin that protrudes above a substrate, wherein the gate structure is surrounded by a dielectric layer; forming a nitride layer over the gate structure; forming an etch stop layer over the nitride layer; forming an oxide layer over the etch stop layer; forming a first opening that extends through the oxide layer, through the etch stop layer, and into the nitride layer by a first dry etch process; cleaning the first opening by a wet etch process after the first dry etch process; after cleaning the first opening, extending the first opening through the nitride layer by a second dry etch process; and filling the first opening with a conductive material after the second dry etch process. In an embodiment, the first dry etch process is a first plasma etch process performed with a first bias power, and the second dry etch process is a second plasma etch process performed with a second bias power lower than the first bias power. In an embodiment, the method further includes: forming a second opening that extends through the oxide layer and through the etch stop layer by the first dry etch process, wherein a bottom of the second opening exposes a metal area disposed between the etch stop layer and the nitride layer; etching through the metal area by the wet etch process; and extending the second opening through the nitride layer by the second dry etch process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a gate structure over a fin, the fin protruding above a substrate, the gate structure being surrounded by an interlayer dielectric (ILD) layer;
    recessing the gate structure below an upper surface of the ILD layer distal from the substrate;
    after the recessing, forming a first dielectric layer over the recessed gate structure;
    forming an etch stop layer over the first dielectric layer and the ILD layer;
    forming a second dielectric layer over the etch stop layer;
    performing a first plasma etch process to form a first opening that extends through the second dielectric layer, through the etch stop layer, and into the first dielectric layer;

after the first plasma etch process, performing a wet etch process to clean the first opening; and after the wet etch process, performing a second plasma etch process to extend the first opening through the first dielectric layer.

2. The method of claim 1, wherein forming the gate structure comprises:

forming a dummy gate structure over the fin;

forming the ILD layer over the fin around the dummy gate structure; and replacing the dummy gate structure with the gate structure, comprising:

removing the dummy gate structure to form a recess in the ILD layer; and forming the gate structure in the recess over the fin.

3. The method of claim 1, further comprising, after the second plasma etch process, forming a via by filling the first opening with a conductive material.

4. The method of claim 1, wherein an upper surface of the first dielectric layer is formed to be level with the upper surface of the ILD layer.

5. The method of claim 4, further comprising, after recessing the gate structure and before forming the first dielectric layer:

recessing gate spacers of the gate structure below the upper surface of the ILD layer; and forming a capping layer between the recessed gate spacers over the recessed gate structure, wherein the capping layer is formed of a conductive material, wherein the first dielectric layer is formed over the recessed gate spacers and the capping layer.

6. The method of claim 1, wherein the first plasma etch process is performed with a first bias power, and the second plasma etch process is performed with a second bias power different from the first bias power.

7. The method of claim 6, wherein the second bias power is lower than the first bias power.

8. The method of claim 1, wherein the first dielectric layer is formed of a nitride material, and the second dielectric layer is formed of an oxide material.

9. The method of claim 8, wherein the first plasma etch process is performed using a first process gas comprising $C_4F_6$, $C_4F_8$, or $CH_2F_2$, and the second plasma etch process is performed using a second process gas comprising $CH_2F_2$ and $H_2$.

10. The method of claim 9, wherein the wet etch process is performed using a chemical comprising HCl and $H_2CO_3$.

11. The method of claim 1, further comprising, after forming the first dielectric layer and before forming the etch stop layer:

forming a second opening in the ILD layer adjacent to the gate structure, wherein the second opening exposes an underlying source/drain region;

filling the second opening with a conductive material; and after the filling, performing a planarization process to remove portions of the conductive material disposed outside the second opening.

12. The method of claim 11, wherein after the planarization process, a residue portion of the conductive material remains on an upper surface of the first dielectric layer, wherein the method further comprises:

forming a third opening that extends through the second dielectric layer and the etch stop layer using the first plasma etch process, wherein a bottom of the third opening exposes the residue portion of the conductive material;

etching through the residue portion of the conductive material to expose the first dielectric layer using the wet etch process; and extending the third opening through the first dielectric layer using the second plasma etch process.

13. A method of forming a semiconductor device, the method comprising:

forming a first dielectric layer over a gate structure;

forming a second dielectric layer over the first dielectric layer;

forming an opening that extends through the second dielectric layer and into the first dielectric layer using a first dry etch process;

after the first dry etch process, wet cleaning the opening;

after the wet cleaning, extending the opening through the first dielectric layer using a second dry etch process; and after extending the opening, filling the opening with a conductive material.

14. The method of claim 13, wherein the first dry etch process is a first plasma process, and the second dry etch process is a second plasma process.

15. The method of claim 14, wherein a first bias power of the first plasma process is higher than a second bias power of the second plasma process.

16. The method of claim 14, wherein the first dielectric layer is a nitride, and the second dielectric layer is an oxide, wherein the first plasma process is performed using a first process gas comprising $C_4F_6$, $C_4F_8$, or $CH_2F_2$, the second plasma process is performed using a second process gas comprising $CH_2F_2$ and $H_2$, and the wet cleaning is performed using a wet clean chemical comprising HCl and $H_2CO_3$.

17. The method of claim 16, wherein the gate structure is surrounded by an interlayer dielectric (ILD) layer, wherein the method further comprises recessing the gate structure before forming the first dielectric layer, wherein the first dielectric layer is formed to have a coplanar upper surface with the ILD layer.

18. A method of forming a semiconductor device, the method comprising:

forming a gate structure over a fin, wherein the fin protrudes above a substrate, wherein the gate structure is surrounded by an interlayer dielectric (ILD) layer;

recessing the gate structure below an upper surface of the ILD layer;

forming a first dielectric layer over the recessed gate structure;

forming a second dielectric layer over the first dielectric layer;

forming a first opening that extends through the second dielectric layer and into the first dielectric layer by performing a first dry etch process;

after performing the first dry etch process, cleaning the first opening by a wet etch process;

after cleaning the first opening, extending the first opening through the first dielectric layer by performing a second dry etch process; and filling the first opening with a conductive material after performing the second dry etch process.

19. The method of claim 18, wherein the first dry etch process is a first plasma etch process performed with a first bias power, and the second dry etch process is a second plasma etch process performed with a second bias power lower than the first bias power.

20. The method of claim 18, further comprising:
- forming a second opening that extends through the second dielectric layer by the first dry etch process, wherein a bottom of the second opening exposes a metal area disposed between the second dielectric layer and the first dielectric layer;
- etching through the metal area by the wet etch process; and
- extending the second opening through the first dielectric layer by the second dry etch process.

\* \* \* \* \*